(12) United States Patent
Gebauer et al.

(10) Patent No.: US 10,271,421 B2
(45) Date of Patent: *Apr. 23, 2019

(54) SYSTEMS AND METHODS FOR PROVIDING ELECTROMAGNETIC INTERFERENCE (EMI) SHIELDING BETWEEN INDUCTORS OF A RADIO FREQUENCY (RF) MODULE

(71) Applicant: Avago Technologies General IP (Singapore) Pte. Ltd., Singapore (SG)

(72) Inventors: Bernhard Gebauer, Tuntenhausen (DE); Oliver Wiedenmann, Munich (DE); Sarah Haney, San Jose, CA (US); Lueder Elbrecht, Munich (DE); Deog-Soon Choi, Seoul (KR); Aaron Lee, Seoul (KR)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/499,657

(22) Filed: Apr. 27, 2017

(65) Prior Publication Data

US 2018/0098417 A1 Apr. 5, 2018

Related U.S. Application Data

(63) Continuation of application No. 15/282,882, filed on Sep. 30, 2016, now Pat. No. 10,076,023.

(51) Int. Cl.
*H05K 1/02* (2006.01)
*H05K 1/16* (2006.01)
(Continued)

(52) U.S. Cl.
CPC ....... *H05K 1/0216* (2013.01); *H01F 27/2804* (2013.01); *H01F 41/041* (2013.01);
(Continued)

(58) Field of Classification Search
None
See application file for complete search history.

(56) References Cited

U.S. PATENT DOCUMENTS

| 5,166,772 A | 11/1992 | Soldner et al. |
| 8,012,868 B1 * | 9/2011 | Naval .......... H01L 23/552 |
| | | 257/784 |

(Continued)

FOREIGN PATENT DOCUMENTS

CN 104659022 A1 5/2015

OTHER PUBLICATIONS

Lee, et al., "A Method of Partial Encapsulation with Conductive Material for Compartment EMI Shield", IP.com Prior Art Database Technical Disclosure, IP.com No. IPCOM000245016D, IP.com Electronic Publication Date: Feb. 5, 2016.

(Continued)

*Primary Examiner* — Lana N Le

(57) ABSTRACT

Electrically-conductive wires are used to construct an EMI shield between inductors of an RF module that prevents, or at least reduces, EMI crosstalk between the inductors while maintaining high Q factors for the inductors. The EMI shield comprises at least a first set of electrically-conductive wires that at least partially surrounds and extends over at least a first inductor of a pair of inductors. Adjacent wires of the first set are spaced apart from one another by a predetermined distance selected to ensure that the EMI shield attenuates a frequency or frequency range of interest. First and second ends of each of the wires are connected to an electrical ground structure. A length of each wire in between the first and second ends of the respective wire extends above the first inductor and is spaced apart from the first inductor so as not to be in contact with the first inductor.

17 Claims, 19 Drawing Sheets

(51) Int. Cl.
*H05K 3/30* (2006.01)
*H01F 27/28* (2006.01)
*H01F 41/04* (2006.01)

(52) U.S. Cl.
CPC ............... *H05K 1/165* (2013.01); *H05K 3/30* (2013.01); *H01F 2027/2809* (2013.01)

(56) References Cited

U.S. PATENT DOCUMENTS

| | | | | |
|---|---|---|---|---|
| 8,071,431 | B2* | 12/2011 | Hoang | H01L 23/552 438/124 |
| 8,597,979 | B1* | 12/2013 | Burgyan | H01L 23/3121 257/686 |
| 8,664,030 | B2* | 3/2014 | Luch | H01L 31/02008 136/245 |
| 8,948,712 | B2 | 2/2015 | Chen et al. | |
| 9,754,896 | B2 | 9/2017 | Read et al. | |
| 9,818,699 | B2 | 11/2017 | Kim et al. | |
| 9,947,988 | B2* | 4/2018 | Takashima | H01Q 7/06 |
| 2004/0108581 | A1* | 6/2004 | Li | H01L 25/0657 257/678 |
| 2005/0231855 | A1* | 10/2005 | Tran | G11B 9/14 360/324.1 |
| 2007/0194281 | A1 | 8/2007 | Gao | |
| 2007/0241440 | A1 | 10/2007 | Hoang et al. | |
| 2009/0146270 | A1 | 6/2009 | Buer et al. | |
| 2010/0184327 | A1* | 7/2010 | Carpenter | H01R 13/512 439/607.01 |
| 2012/0143227 | A1* | 6/2012 | Steckel | A61L 27/04 606/151 |
| 2013/0043961 | A1 | 2/2013 | Gebauer et al. | |
| 2013/0286609 | A1 | 10/2013 | Merz | |
| 2013/0323974 | A1* | 12/2013 | Gutierrez | H01F 5/003 439/620.15 |
| 2014/0078677 | A1 | 3/2014 | Dolci et al. | |
| 2014/0252568 | A1* | 9/2014 | Hwang | H01L 23/552 257/659 |
| 2016/0120039 | A1 | 4/2016 | Bang et al. | |
| 2017/0263568 | A1* | 9/2017 | Jeon | H01L 23/552 |
| 2017/0290155 | A1 | 10/2017 | Elsherbini et al. | |
| 2017/0290209 | A1 | 10/2017 | Craig | |
| 2017/0309394 | A1* | 10/2017 | Blow | H01F 17/04 |
| 2017/0337317 | A1 | 11/2017 | Chen et al. | |

OTHER PUBLICATIONS

English language machine translation of CN104659022A1, 6 pages.

* cited by examiner

US 10,271,421 B2

SYSTEMS AND METHODS FOR PROVIDING ELECTROMAGNETIC INTERFERENCE (EMI) SHIELDING BETWEEN INDUCTORS OF A RADIO FREQUENCY (RF) MODULE

CROSS-REFERENCE TO RELATED APPLICATIONS

This application is a continuation-in-part application of and claims the benefit of the filing date of a nonprovisional application having U.S. application Ser. No. 15/282,882 entitled "SYSTEMS AND METHODS FOR PROVIDING ELECTROMAGNETIC INTERFERENCE (EMI) COMPARTMENT SHIELDING FOR COMPONENTS DISPOSED INSIDE OF SYSTEM ELECTRONIC PACKAGES," filed on Sep. 30, 2016, which is hereby incorporated by reference herein in its entirety.

TECHNICAL FIELD OF THE INVENTION

The invention relates to electromagnetic interference (EMI) shielding. More particularly, the invention relates to providing EMI shielding between inductors of an radio frequency (RF) module.

BACKGROUND OF THE INVENTION

A system-in-a-package (SiP) is a module package that contains a plurality of integrated circuit (IC) chips and/or other circuit components (e.g., transistors, capacitors, indictors and resistors) that are mounted on a system printed circuit board (PCB), which is also part of the SiP module package. Such module packages are commonly used in wireless devices, such as smart phones, for example. The module package typically includes a system epoxy molding compound (EMC) that encapsulates the IC chips and other circuit components. The module package typically also includes a system EMI shield for reducing EMI emission from the module package. The system EMI shield is typically a conformal EMI shield formed on the module package by using, for example, a metal sputtering process to form a metal coating that conforms to the outer surface of the system EMC.

While the system EMI shield is effective at reducing EMI emissions from the module package as a whole, it has no effect on EMI emissions within the module package. Some of the ICs and other circuit components contained within the module package comprise an RF module made up of RF functional blocks. These RF functional blocks emit EMI that can interfere with the operations of other RF functional blocks within the module package. For example, one of the IC chips of one of the RF functional blocks may be a multi-band power amplifier (PA) chip supporting different modes of operation (e.g., Code Division Multiple Access (CDMA), Universal Mobile Telecommunications System (UMTS), Long Term Evolution (LTE), and Global System for Communication (GSM)/Enhanced Data GSM Environment (EDGE)). Another of the IC chips of another of the RF functional blocks may be, for example, a multi-band low noise amplifier (LNA) chip capable of supporting different modes of operation.

Without suitable EMI shielding of these RF functional blocks from one another, EMI emitted from one RF functional block may detrimentally impact the operations of another RF functional block. One known EMI shielding solution that is used for this purpose is an electrically-conductive metal "can" that is placed over an RF functional block to reduce EMI emissions from the RF functional block. However, current trends to reduce the sizes of SiPs and/or to increase the amounts or types of functionality that are included in them have made the use of electrically-conductive metal cans impractical due to their size and due to space constraints of environments in which the SiPs are used (e.g., smart phones).

Next-generation of RF modules are required to be smaller and thinner than current RF modules and to provide EMI shielding. In addition, a greater number of frequency bands and wireless standards need to be integrated into the RF modules, while also providing the modules with highly-compact footprints and increased package density. These objectives are only possible if the electrically-conductive traces that are routed within each RF module are isolated from one another to prevent unwanted EMI crosstalk.

Inductors are ubiquitous circuit elements used in RF modules, and their design is often critical for optimum system performance. Therefore, a high quality (Q) factor is needed to enable these inductors to achieve low signal losses. In order to obtain inductors with high Q factors, it is essential that the magnetic field surrounding the inductors is not disturbed by grounded metal areas nearby. However, this constraint contradicts the requirements described above because inductors that are not shielded by grounded metal planes or via walls are prone to undesirable EMI crosstalk.

FIG. 1 is a top perspective view of a portion of a multilayer PCB 1 having first and second inductors 2 and 3, respectively, formed in it that are parallel to one another and that have coils 4 and 5, respectively, that are formed in different metal layers 6 and 7 of the multilayer PCB 1. The metal layers 6 and 7 are parallel to one another and parallel to a top surface 1$a$ of the PCB 1. As electrical current flows through the coils 4 and 5, the inductors 2 and 3 generate respective magnetic fluxes that are substantially parallel to respective axes of the respective inductors 2 and 3 and perpendicular to the top surface 1$a$ and to the metal layers 6 and 7 of the multilayer PCB 1. The magnetic flux generated by the first inductor 2 is essentially EMI crosstalk to the second inductor 3 that can degrade the performance of second inductor 3, and vice versa.

The inductors 2 and 3 exhibit the best possible Q factor if surrounding electrical ground planes (not shown) and via walls (not shown) are as far from the inductors 2 and 3 as possible. Ground planes (not shown) above the inductors 2 and 3 degrade their respective Q factors, but are sometimes needed to eliminate coupling of EMI from other signal sources into the inductors 2 and 3. This is particularly important for self-EMI-shielded modules that have an electrically-conducting sheet (not shown) on top of the molded package in which mirror currents from other signal sources can flow and couple into the inductors 2 and 3.

Accordingly, a need exists for way to prevent, or at least reduce, this type of EMI crosstalk while maintaining high Q factors for the inductors.

DETAILED DESCRIPTION

Figure 1:
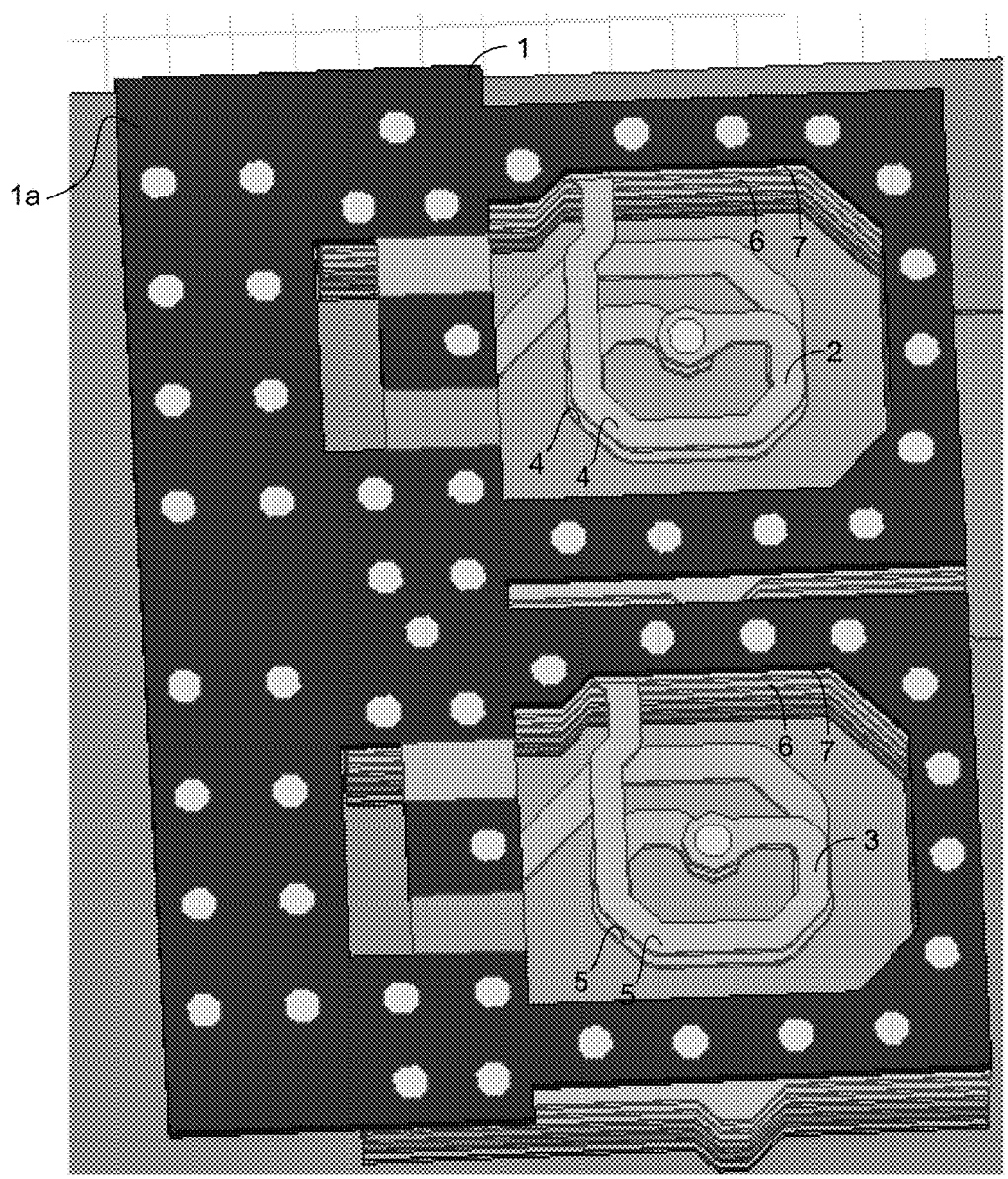
FIG. 1 is a top perspective view of a portion of a known multilayer PCB having first and second inductors formed therein that are parallel to one another and that have respective coils that are formed in different metal layers of the multilayer PCB.

In accordance with a representative embodiment, electrically-conductive wires are used to construct an EMI shield between inductors of an RF module that prevents, or at least reduces, EMI crosstalk between the inductors while maintaining high Q factors for the inductors. The EMI shield comprises at least a first set of electrically-conductive wires that at least partially surrounds and extends over at least a first inductor of a pair of inductors. Adjacent wires of the first set are spaced apart from one another by a predetermined distance selected to ensure that the EMI shield attenuates a frequency or frequency range of interest. First and second ends of each of the wires are connected to an electrical ground structure. A length of each wire in between the first and second ends of the respective wire extends above the first inductor and is spaced apart from the first inductor so as not to be in contact with the first inductor.

In accordance with other representative embodiments, a compartment EMI shield for use inside of a system module package is provided that comprises at least a first set of electrically-conductive wires that surrounds and extends over circuitry comprising one or more electrical components of the module package. Adjacent wires of the first set are spaced apart from one another by a predetermined distance selected to ensure that the compartment EMI shield attenuates a frequency or frequency range of interest. First and second ends of each of the wires are connected to an electrical ground structure. A length of each wire that is located in between the first and second ends of the respective wire extends above the circuitry and is spaced apart from the component(s) of the circuitry so as not to be in contact with the component(s). The one or more electrical components of the circuitry are mounted on a top surface of a PCB of the module package or on a top surface of a substrate that is mounted on the top surface of the system PCB. A common electrical ground structure extends about a periphery of the circuitry. The lengths of the wires of the first set that extend above the circuitry are substantially parallel to one another and, in some embodiments, lie in a plane that is substantially parallel to a plane in which the surface on which the one or more electrical components are mounted lies. It is not necessary for the lengths of the wires that extend above the circuitry to be substantially parallel to the plane in which the surface on which the one or more electrical components are mounted lies, but it is the most practical way to make the compartment EMI shield and efficient way in terms of space utilization.

In the following detailed description, for purposes of explanation and not limitation, exemplary, or representative, embodiments disclosing specific details are set forth in order to provide a thorough understanding of inventive principles and concepts. However, it will be apparent to one of ordinary skill in the art having the benefit of the present disclosure that other embodiments according to the present teachings that are not explicitly described or shown herein are within the scope of the appended claims. Moreover, descriptions of well-known apparatuses and methods may be omitted so as not to obscure the description of the exemplary or representative embodiments. Such methods and apparatuses are clearly within the scope of the present teachings, as will be understood by those of skill in the art. It should also be understood that the word "example," as used herein, is intended to be non-exclusionary and non-limiting in nature. More particularly, the words "exemplary" or "representative" as used herein indicate one among several examples, and it must be understood that no undue emphasis or preference is being directed to the particular example being described. It should also be understood that the words "exemplary" or "representative" as used herein, are intended to be non-exclusionary and non-limiting in nature and indicate one among several examples, and no undue emphasis or preference is being directed to the particular example being described.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a," "an" and "the" include both singular and plural referents, unless the context clearly dictates otherwise. Thus, for example, "a device" includes one device and plural devices. The terms "substantial" or "substantially" mean to within acceptable limits or degrees acceptable to those of skill in the art. For example, the term "substantially parallel to" means that a structure or device may not be made perfectly parallel to some other structure or device due to tolerances or imperfections in the process by which the structures or devices are made. The term "approximately" means to within an acceptable limit or amount to one of ordinary skill in the art. Relative terms, such as "over," "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Representative embodiments will now be described with reference to the figures, in which like reference numerals represent like components, elements or features. It should be noted that features, elements or components in the figures are not intended to be drawn to scale, emphasis being placed instead on demonstrating inventive principles and concepts. Representative embodiments of the EMI shield that is used to prevent or reduce EMI crosstalk between inductors while maintaining high Q factors for the inductors are described with reference to FIGS. 2 and 3. Representative embodiments of the compartment EMI shield are described below with reference to FIGS. 4-14. It should be noted that the description of FIGS. 14A-24 corresponds, almost identically, to the description of FIGS. 1A-11, respectively, provided in the parent application referred to above having U.S. application Ser. No. 15/282,882. The claims appended hereto are directed primarily toward the inventive principles and concepts described herein with reference to FIGS. 2-13.

Figure 2:
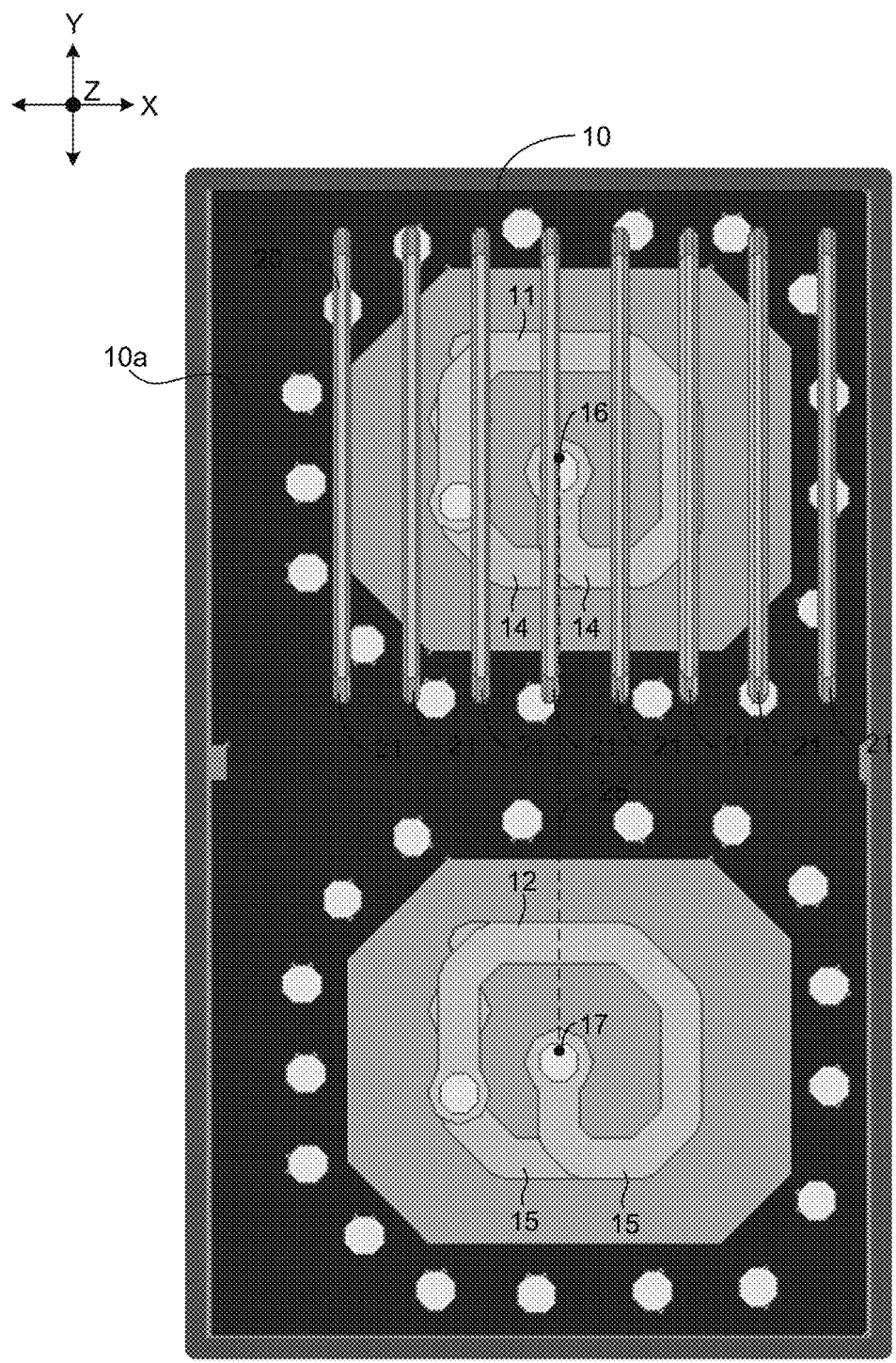
FIG. 2 illustrates a top view of a portion of multi-layer PCB having first and second inductors formed therein, one of which is equipped with an EMI shield that eliminates or reduces EMI crosstalk between the inductors while maintaining high Q factors for the inductors.

FIG. 2 illustrates a top perspective view of a portion of an RF module comprising a multilayer PCB 10 having first and second inductors 11 and 12, respectively, formed therein, and having an EMI shield 20 that eliminates or reduces EMI crosstalk between the inductors 11 and 12 while maintaining high Q factors for the inductors 11 and 12. Each of the first and second inductors 11 and 12 has N coils 14 and 15, respectively, where N is a positive integer that is greater than or equal to one. The coils 14 and 15 are formed in N respective metal layers of the multilayer PCB 10. The PCB 10 may be identical to the PCB 1 shown in FIG. 1 in which the metal layers 6 and 7 are parallel to one another and parallel to the top surface 1a of the multilayer PCB 1. Thus, the metal layers of the multilayer PCB 10 are parallel to one another and parallel to a top surface 10a of the multilayer PCB 10.

It should be noted that although the RF module has been described as incorporating a multi-layer PCB 10 on which the inductors 11 and 12 in which the inductors 11 and 12 are formed, any suitable multi-layer substrate may be used for this purpose.

Figure 3:
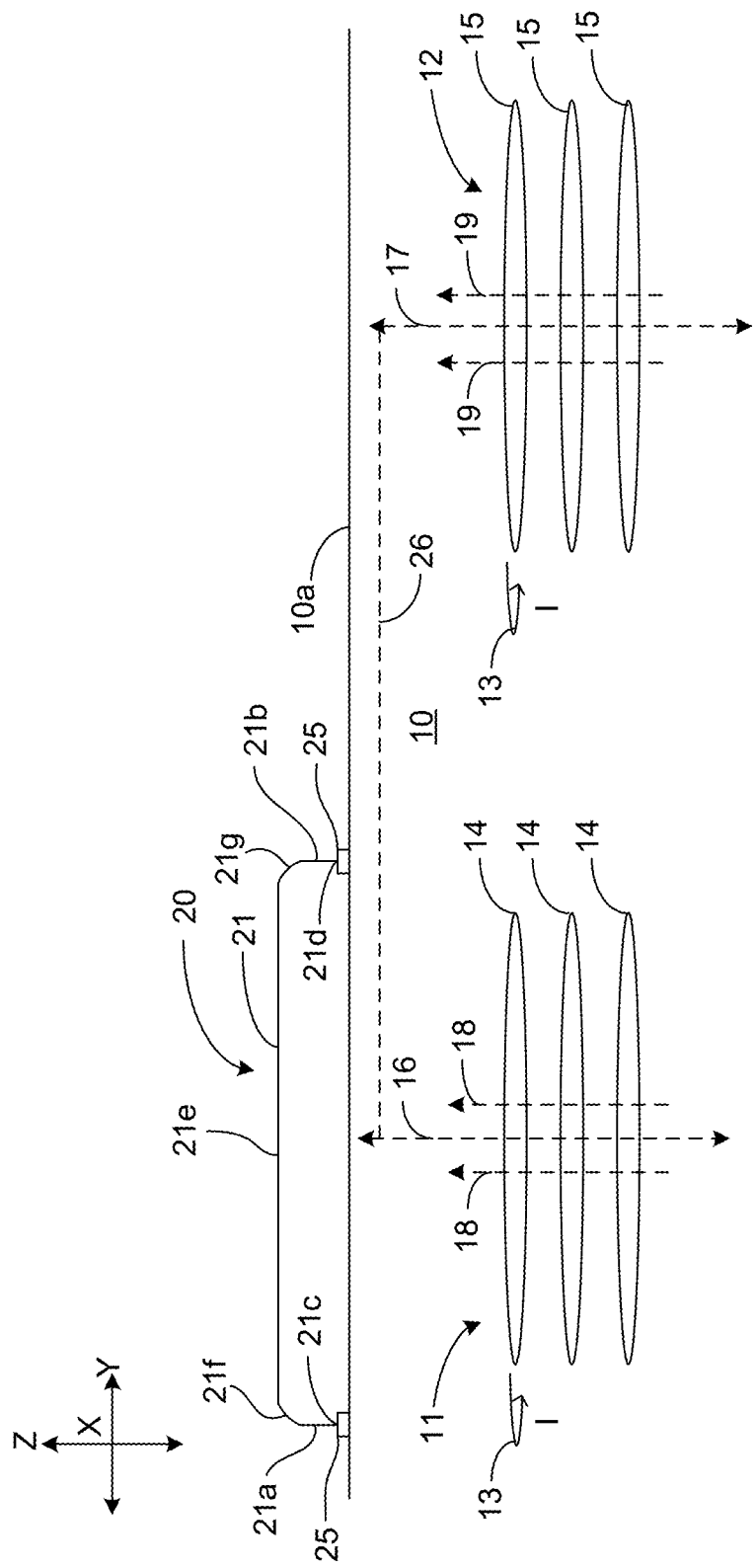
FIG. 3 illustrates a side cross-sectional view of the portion of the multi-layer PCB shown in FIG. 2 having the first and second inductors formed therein, one of which is equipped with an EMI shield that eliminates or reduces EMI crosstalk between the inductors while maintaining high Q factors for the inductors.

FIG. 3 illustrates a simplified block diagram of the first and second inductors 11 and 12, respectively, shown in FIG. 2. The first and second inductors 11 and 12, respectively, are substantially parallel to one another in that their coils 14 and 15, respectively, are formed in metal layers of the multilayer PCB 10 that are substantially parallel to one another. Stated another way, the first and second inductors 11 and 12, respectively, have first and second axes 16 and 17, respectively, that are substantially parallel to one another, substantially perpendicular to the layers of the multilayer PCB 10, including top surface 10a, and that are generally centered within the coils 14 and 15, respectively.

As electrical current, I, flows through the coils 14 and 15 of the first and second inductors 11 and 12, respectively, in, for example, a first direction indicated by the arrows 13 shown in FIG. 3, the first and second inductors 11 and 12, respectively, generate respective magnetic fluxes represented by flux lines 18 and 19, respectively. The magnetic fluxes represented by the flux lines 18 and 19 are substantially parallel to the axes 16 and 17 of the inductors 11 and 12 and substantially perpendicular to the layers of the multilayer PCB 10. If the electrical current I flows in the coils 14 and 15 in a direction opposite to the direction indicated by the arrows 13, the magnetic fluxes will be directed in a direction that is opposite to the direction represented by the flux lines 18 and 19. As indicated above, the magnetic fluxes correspond to EMI crosstalk for which an EMI shielding solution is needed that prevents EMI crosstalk generated by the first inductor 11 from degrading the Q factor of the second inductor 12, and vice versa.

With reference again to FIG. 2, the EMI shield 20 is constructed of electrically-conductive wires 21, which at least partially surround and extend over the first inductor 11. The pitch, or lateral distance, $D_L$, between adjacent wires 21, the thickness, T, of the wires 21, and the vertical distance, $D_V$ (i.e., distance in the Z-direction) from the top surface 10a of the PCB 10 to the wires 21 in directions normal to the top surface 10a are preselected based on a number of factors. In general, the shorter the lateral distance $D_L$, the more effective the EMI shield 20 is at attenuating EMI crosstalk, but typically is not less than about 150 micrometers (microns).

The vertical distance $D_V$ generally has no bearing on how effective the EMI shield 20 is at attenuating EMI, but can have an effect on the Q factors of the inductors 11 and 12. For maximum inductor Q factor, the vertical distance $D_V$ should be equal to or greater than the lateral distance between the coils 14 and 15 of the inductors 11 and 12, respectively, and any lateral electrical ground plane (not shown), i.e., any electrical ground plane that is parallel to the X-Z or Y-Z planes of the X, Y, Z Cartesian coordinate system.

The wires 21 are typically bond wires of the type that are used in wire bonding processes to electrically interconnect electrical contacts of a component to electrical contacts of another component or electrical contacts of a PCB. In accordance with a representative embodiment, the EMI shield 20 is formed during the wire bonding process that is used to make such interconnections. In other exemplary embodiments, the EMI shield 20 is pre-formed and then attached to the common electrical ground structure. The thickness of the bond wires 21 ranges from about 10 microns to about 500 microns, and is typically from about 12 microns to about 60 microns. The bond wires 21 are typically made of gold or copper. It should be noted, however, that the inventive principles and concepts are not limited to the bond wires 21 having any particular thickness or range of thickness or to being made of any particular electrically-conductive material. A thickness that ranges from about 12 microns (0.5 mils) to about 60 microns (2.36 mils) ensures that the bond wires 21 are thick enough to prevent wire sweep and yet thin enough to allow the desired bend angles to be achieved.

With reference again to FIG. 3, each bond wire 21 has first and second wire portions 21a and 21b, respectively, that have first ends 21c and 21d, respectively, that are electrically coupled to an electrical ground structure 25 of the PCB 10. Although the electrical ground structure 25 is shown disposed on the top surface 10a of the PCB 10 for illustrative purposes, the electrical ground structure 25 may be in a layer that is disposed beneath the top surface 10a of the PCB 10. Each bond wire 21 has a third wire portion 21e that extends between the first and second wire portions 21a and 21b, respectively, of the bond wire 21. Each bond wire 21 has first and second bends 21f and 21g, respectively, formed in it where the first and second wire portions 21a and 21b, respectively, transition into the third wire portion 21e. In accordance with this representative embodiment, the first and second wire portions 21a and 21b are substantially parallel to one another and substantially perpendicular to the top surface 10a of the PCB 10. In accordance with this representative embodiment, the third wire portions 21e are generally parallel to one another and to the top surface 10a of the PCB 10.

As shown in FIGS. 2 and 3, the EMI shield 20 partially surrounds the first inductor 11 and extends over the first inductor 11. The wires 21 comprising the EMI shield 20 are at an angle, $\beta$, to a line 26 drawn between the axes 16 and 17 of the inductors 11 and 12 normal to the axes 16 and 17. In the representative embodiment shown in FIGS. 2 and 3, the wires 21 are parallel to the line 26, and thus the angle $\beta=0°$, but $\beta$ can be any angle in the range of 0° to 359°. The angle $\beta$ is preselected in large part on the positions and orientations of the inductors 11 and 12 on the PCB 10 and the distance between the inductors 11 and 12. Therefore, some testing or simulation are typically needed once the layout of the inductors 11 and 12 is known to determine a suitable value for $\beta$, as well as suitable values for $D_L$, $D_V$ and T. Persons of skill in the art will understand, in view of the description provided herein, the manner in which suitable values for $\beta$, T, $D_L$ and $D_V$ can be determined through testing or simulations.

Figure 4:
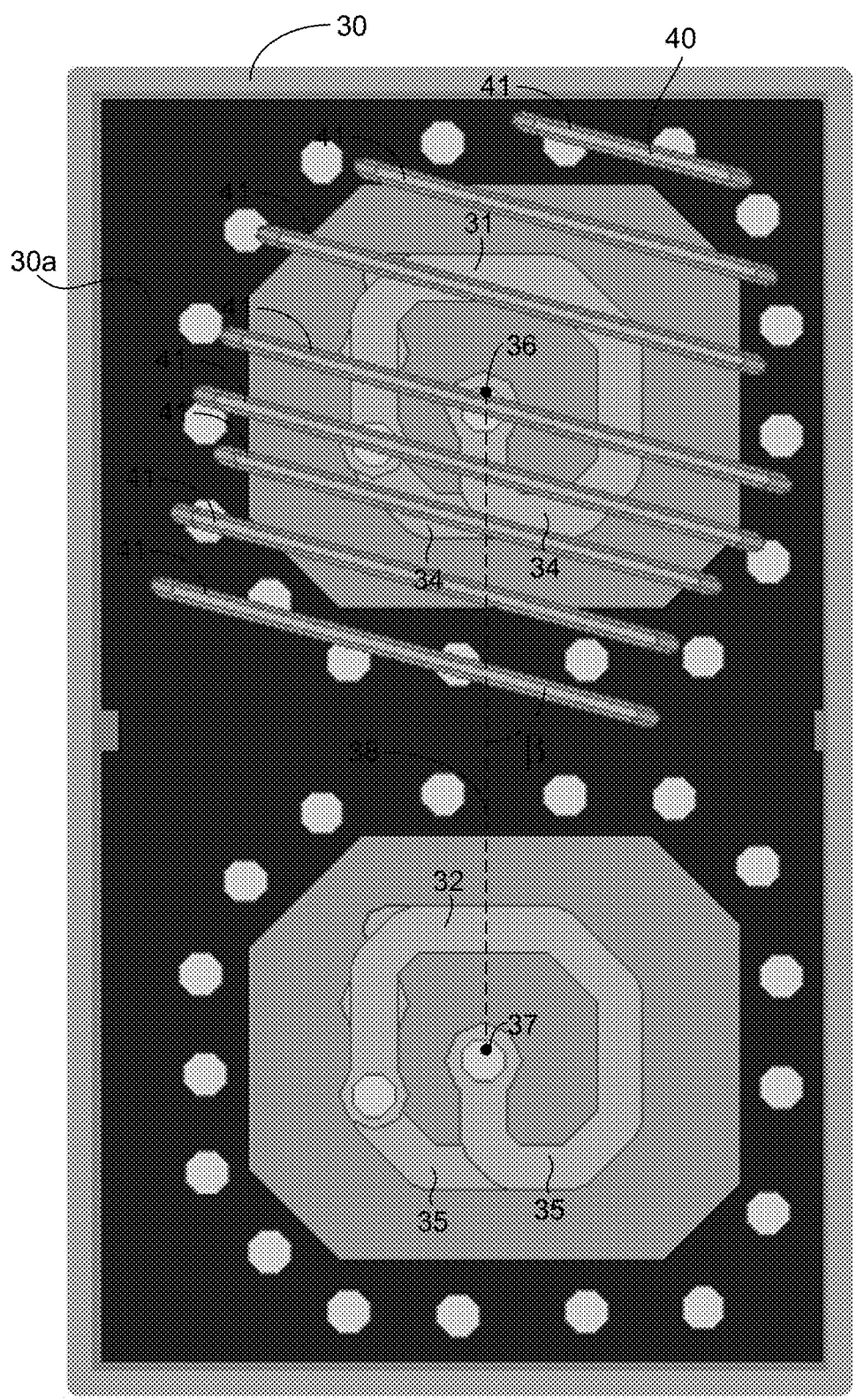
FIG. 4 illustrates a top view of a portion of multi-layer PCB having first and second inductors formed therein, one of which is equipped with an EMI shield that eliminates or reduces EMI crosstalk between the inductors while maintaining high Q factors for the inductors.

FIG. 4 illustrates a top perspective view of a portion of an RF module comprising a multilayer PCB 30 having first and second inductors 31 and 32, respectively, formed therein, and having an EMI shield 40 that eliminates or reduces EMI crosstalk between the inductors 31 and 32 while maintaining high Q factors for the inductors 31 and 32. Each of the first and second inductors 31 and 32 has N coils 34 and 35, respectively, where N is a positive integer that is greater than or equal to one. The coils 34 and 35 are formed in N respective metal layers of the multilayer PCB 20. The PCB 30 may be identical to the PCB 10 shown in FIG. 2.

The first and second inductors 31 and 32, respectively, have first and second axes 36 and 37, respectively, that are substantially parallel to one another and perpendicular to a top surface 30a of the PCB 30. As electrical currents flow in the coils 34 and 35, the first and second inductors 31 and 32 generate first and second magnetic fluxes, respectively, that are substantially perpendicular to the top surface 30a of the PCB 30. The EMI shield 40 partially surrounds and extends over the first inductor 31. The EMI shield 40 comprises electrically conductive wires 41 that are substantially parallel to one another and to the top surface 30a of the PCB 30. The wires 41 are typically bond wires. The later distance $D_L$, the vertical distance $D_V$, the thickness T and the angle $\beta$ are preselected in the manner described above with reference to FIGS. 2 and 3. In accordance with this representative embodiment, the angle $\beta$ of the wires 41 relative to a line 38 drawn between the axes 36 and 37 normal to the axes 36 and 37 is a non-zero-degree angle. In accordance with this representative embodiment, the angle $\beta$ is approximately 80°. As stated above, the angle $\beta$ is preselected based on the position, orientation and distance between the inductors 31 and 32 and may be any angle ranging from 0° to 359°.

Figure 5A:
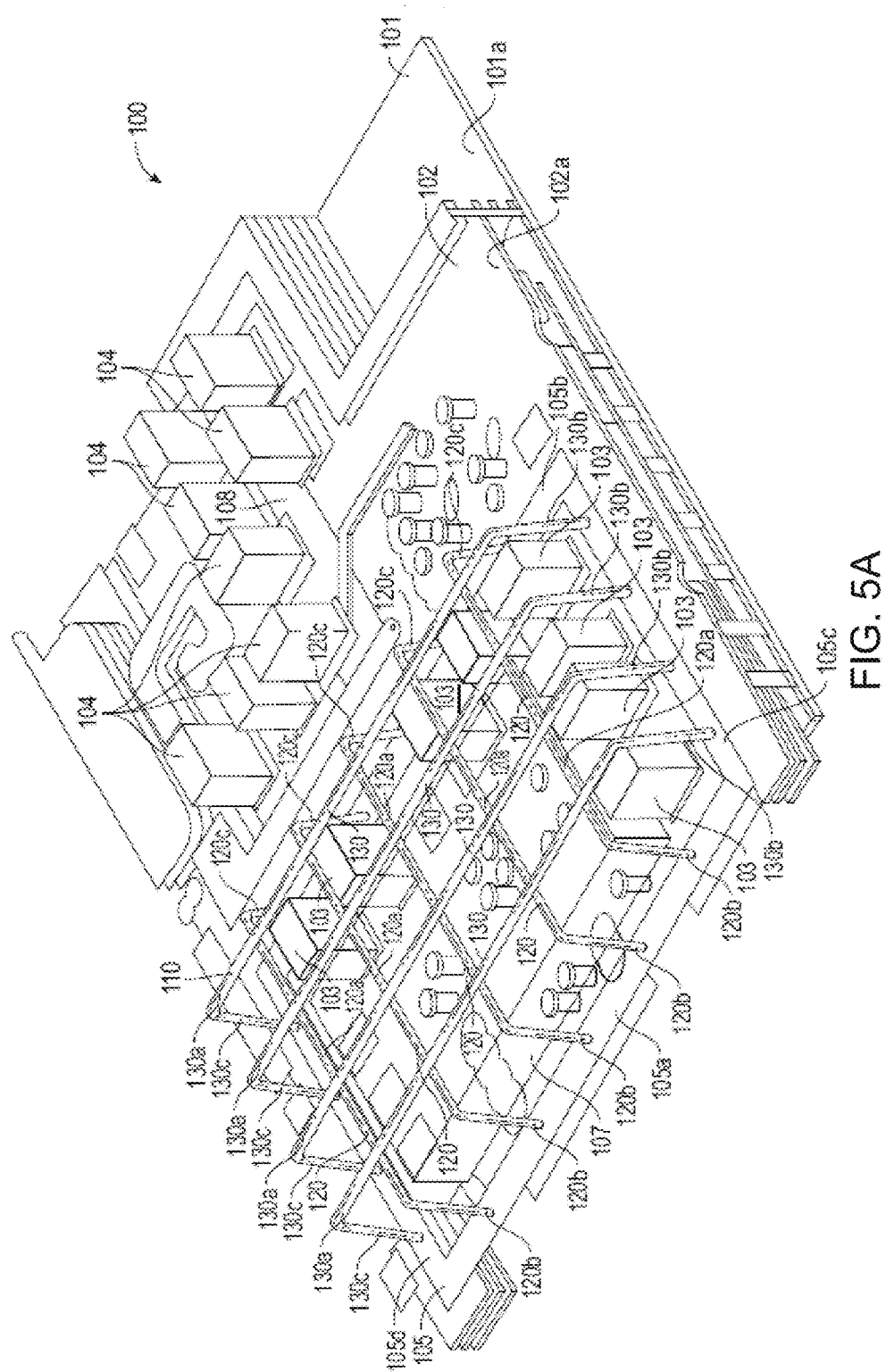
FIGS. 5A and 5B illustrate top perspective and top plan views, respectively, of a portion of an SiP module package having a compartment EMI shield in accordance with a representative embodiment.
Figure 5B:
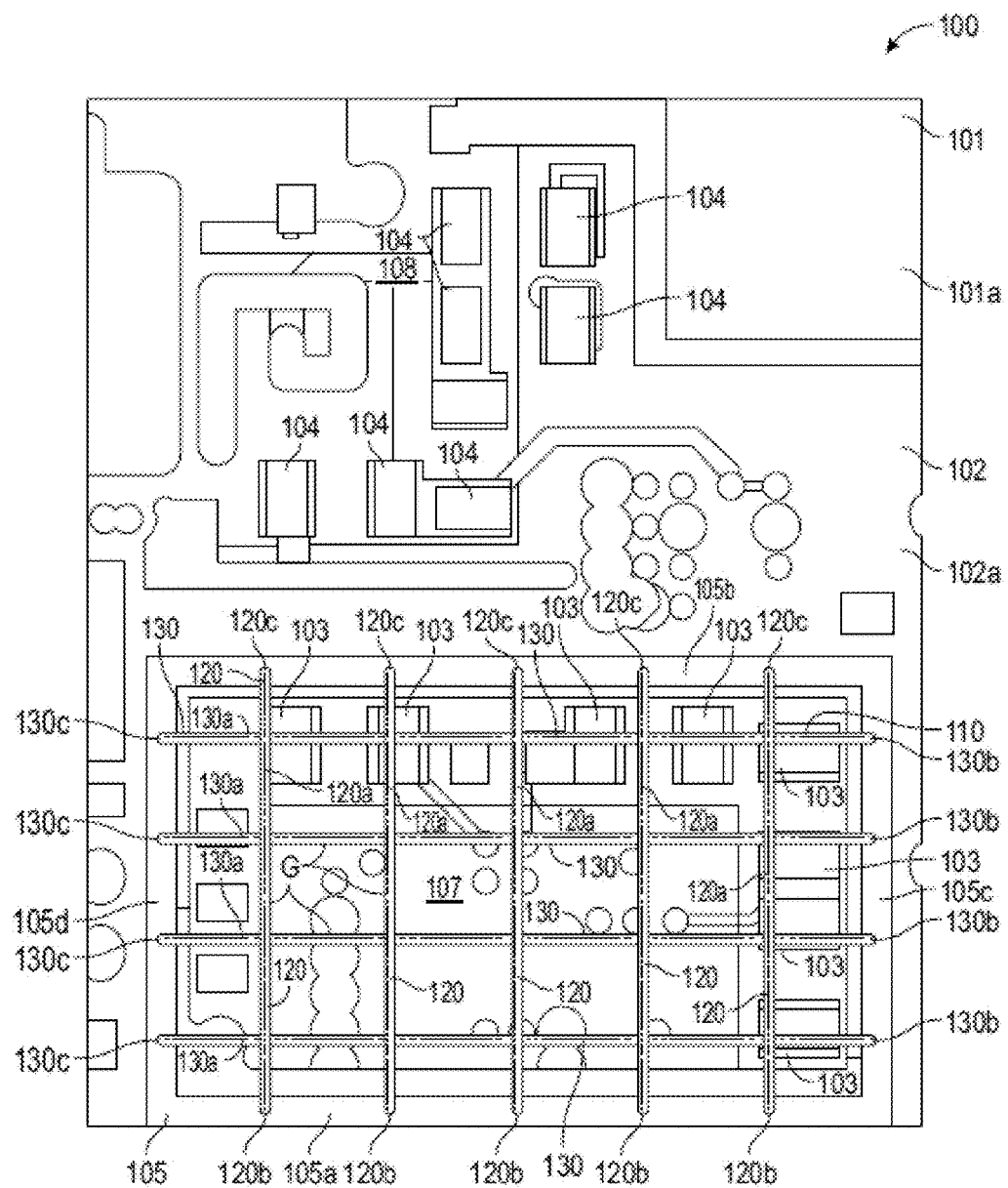

FIGS. 5A and 5B illustrate top perspective and top plan views, respectively, of a portion of an SiP module package 100 having a compartment EMI shield 110 in accordance with a representative embodiment. In FIGS. 5A and 5B, the EMC of the SiP module package has been omitted so that components inside of the SiP module package 100 are visible. The SiP module package 100 has a system PCB 101, a substrate 102 disposed on a top surface 101a of the system PCB 101, a first set of electrical components 103 mounted on a top surface 102a of the substrate 102, a second set of electrical components 104 mounted on the top surface 102a of the substrate 102, a common electrical ground structure 105 disposed on the top surface 102a of the substrate 102, and the compartment EMI shield 110 secured to the common electrical ground structure 105. The first set of electrical components 103 comprises first circuitry 107. The second set of electrical components 104 comprises second circuitry 108. The compartment EMI shield 110 surrounds and extends over the first circuitry 107.

The term "circuitry" or "functional block," as those terms are used herein, denote at least one electrical component that may be, for example, an active or passive electrical component or an integrated circuit (IC) chip or die. Some of the embodiments described herein show the compartment EMI shield being used to shield circuitry having multiple electrical components, but the circuitry that the compartment EMI shield is used to shield may by a single electrical component, such as an IC die, for example. The terms "SiP module package" or "system module package," as those terms are used herein, denote a package that has multiple functional blocks, at least one of which is shielded by a compartment EMI shield according to the present teachings.

In accordance with this exemplary embodiment, the compartment EMI shield 110 comprises first and second sets of electrically-conductive wires 120 and 130, respectively. First and second ends of the first set of electrically-conductive wires 120 are connected to first and second portions 105a and 105b, respectively, of the common electrical ground structure 105. First and second ends of the second set of electrically-conductive wires 130 are connected to third and fourth portions 105c and 105d, respectively, of the common electrical ground structure 105. A first length 120a of each of the wires 120 of the first set extends over the first circuitry 107 and is spaced apart from the electrical components 103 of the first circuitry 107 so as not to be in contact with the electrical components 103. The first lengths 120a of the wires 120 are substantially parallel to one another. A first length 130a of each of the wires 130 of the second set extends over the first circuitry 107 and is spaced apart from the electrical components 103 of the first circuitry 107 so as not to be in contact with the electrical components 103. The first lengths 130a of the wires 130 are substantially parallel to one another.

In accordance with this exemplary embodiment, the first lengths 130a of the wires 130 are substantially perpendicular to the first lengths 120a of the wires 120. In other words, in accordance with this embodiment, the aforementioned non-zero-degree angle is 90°. Second and third lengths 120b and 120c, respectively, of the wires 120 of the first set extend between opposite ends of their respective first lengths 120a and the common electrical ground structure 105. Ends of the second and third lengths 120b and 120c, respectively, are connected to the first and second portions 105a and 105b, respectively, of the common electrical ground structure 105. Likewise, second and third lengths 130b and 130c of the wires 130 of the second set extend between opposite ends of their respective first lengths 130a of the second wires 130 and the common electrical ground structure 105. Ends of the second and third lengths 130b and 130c, respectively, are connected to the third and fourth portions 105c and 105d, respectively, of the common electrical ground structure.

In the representative embodiment shown in FIGS. 5A and 5B, the first, second and third lengths 120a, 120b and 120c, respectively, of the wires 120 of the first set are straight, but a bend exists in each of the wires 120 where it transitions between the first length 120a and the respective second and third lengths 120b and 120c, respectively. Likewise, the first, second and third lengths 130a, 130b and 130c, respectively, of the wires 130 of the second set are straight, but a bend exists in each of the wires 130 where it transitions between the first lengths 130a and the respective second and third lengths 130b and 130c, respectively. This is merely one of many possible configurations and is not a requirement. In accordance with this illustrative embodiment, the angle of the bends is about 90°. However, there could be a smoother transition between the first lengths 120a and the respective second and third lengths 120b and 120c of the wires 120 of the first set. Likewise, there could be a smoother transition between the first lengths 130a and the respective second and third lengths 130b and 130c of the wires 130 of the second set.

As indicated above, a spacing exists between the top surfaces of the electrical components 103 and the first lengths 120a and 130a of the wires 120 and 130, respectively. A spacing also exists between the side surfaces of the electrical components 103 that are adjacent the periphery of the first circuitry 107 and the second lengths 120b and 130b and third lengths 120c and 130c of the wires 120 and 130, respectively, of the first and second sets, respectively. In most cases, it is desirable for the SiP module packages to have low profiles and to be compact due to spatial constraints in the environments in which they are often used (e.g., handheld wireless devices). Therefore, the spacing between the surfaces of the electrical components 103 and the wires 120 and 130 is typically only large enough to ensure that there is no contact between the electrical components 103 and the wires 120 and 130, even after the EMC (not shown) is over-molded onto the SiP module package.

In the representative embodiment shown in FIGS. 5A and 5B and in the representative embodiments described below, the wires 120 and 130 that are used to form the compartment EMI shield are typically bond wires of the type that are used in wire bonding processes to electrically interconnect electrical contacts of a component to electrical contacts of another component or electrical contacts of a PCB. In accordance with a representative embodiment, the compartment EMI shields are formed during the wire bonding process that is used to make such interconnections. In other exemplary embodiments, the compartment EMI shields are pre-formed and then attached to the common electrical ground structure. Exemplary embodiments of methods for making the compartment EMI shield are described below in more detail with reference to FIGS. 14 and 15.

With reference again to FIG. 5B, the first lengths 120a of wires 120 are at a non-zero-degree angle to the first lengths 130a of wires 130 of the second set. Where adjacent first lengths 120a of the wires 120 of the first set intersect adjacent first lengths 130a of the wires 130 of the second set, intersections exist. Each intersection is bounded on first and second sides by the adjacent first lengths 120a of the wires 120 of the first set and is bounded on third and fourth sides by the adjacent first lengths 130a of the wires 130 of the second set, where the first and second sides of the intersection are substantially parallel to one another and are at a non-zero-degree angle to the third and fourth sides of the intersection. In this exemplary embodiment, the non-zero-degree angle is 90°. The area inside of each intersection bounded by the first lengths 120a and 130a of the wires 120 and 130, respectively, of the first and second sets, respectively, constitutes a gap, G, of a predetermined size selected to ensure that the EMI shield attenuates a frequency or frequency range of interest. In other words, the compartment EMI shield 110 functions as a Faraday cage and the size of the gap, G, is preselected based on the wavelength or wavelength range to be attenuated.

For example, the spacing, or pitch, between adjacent wires 120 of the first set may be 500 micrometers (microns) and the pitch between adjacent wires 130 of the second set may be 400 microns. Therefore, the size of the gaps, G, in this example are 400×500 microns. Using typical bond wires for the wires 120 and 130 and pitches of 500 microns and 400 microns, respectively, this configuration of the compartment EMI shield 110 results in about a 5.4 decibel (dB) improvement in EMI shielding for frequencies ranging from about 1.9 Gigahertz (GHz) to about 2.5 GHz compared to emissions from the first circuitry 107 if no compartment EMI shield is used.

Figure 6:
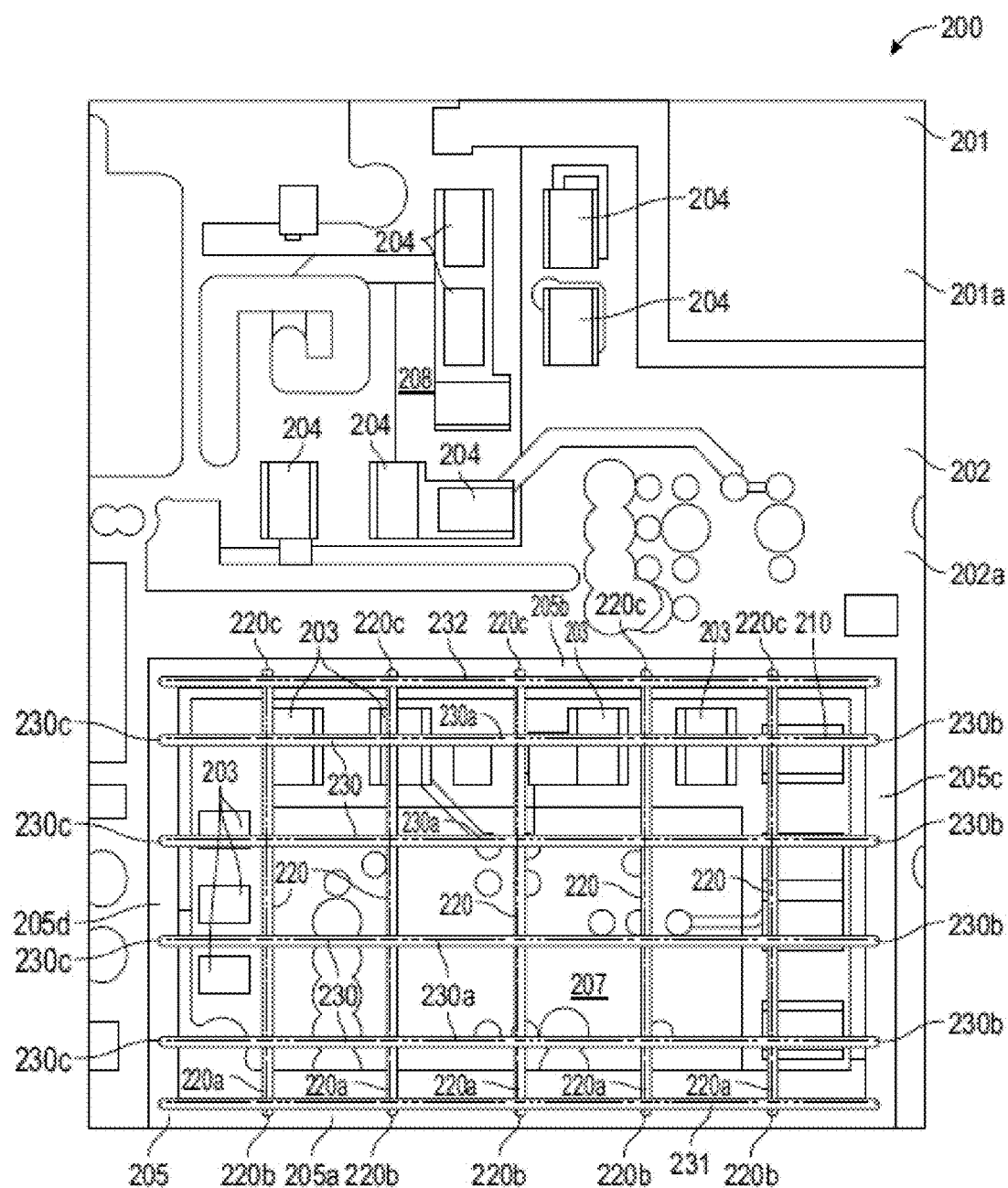
FIG. 6 illustrates a top plan view of a portion of an SiP module package having a compartment EMI shield in accordance with a representative embodiment.

FIG. 6 illustrates a top plan view of a portion of an SiP module package 200 having a compartment EMI shield 210 in accordance with an exemplary embodiment. In FIG. 6, the EMC of the SiP module package has been omitted so that components inside of the SiP module package 200 are visible. The SiP module package 200 has a system PCB 201, a substrate 202 disposed on a top surface 201a of the system PCB 201, a first set of electrical components 203 mounted on a top surface 202a of the substrate 202, a second set of electrical components 204 mounted on the top surface 202a of the substrate 202, a common electrical ground structure 205 disposed on the top surface 202a of the substrate 202, and the compartment EMI shield 210 secured to the common electrical ground structure 205. The first set of electrical components 203 comprises a first circuitry 207. The second set of electrical components 204 comprises a second circuitry 208. The compartment EMI shield 210 surrounds and extends over the first circuitry 207.

As with the representative embodiment shown in FIGS. 5A and 5B, in accordance with this exemplary embodiment, the compartment EMI shield 210 comprises first and second sets of electrically-conductive wires 220 and 230, respectively. First and second ends of the first set of electrically-conductive wires 220 are connected to first and second portions 205a and 205b, respectively, of the common electrical ground structure 205. First and second ends of the second set of electrically-conductive wires 230 are connected to third and fourth portions 205c and 205d, respectively, of the common electrical ground structure 205. A first length 220a of each of the wires 220 of the first set extends over the first circuitry 207 and is spaced apart from the electrical components 203 of the first circuitry 207 so as not to be in contact with the electrical components 203. The first lengths 220a of the wires 220 are substantially parallel to one another. Second and third lengths 220b and 220c, respectively, of the wires 220 of the first set extend between opposite ends of their respective first lengths 220a and the common electrical ground structure 205. Ends of the second and third lengths 220b and 220c, respectively, are connected to the first and second portions 205a and 205b, respectively, of the common electrical ground structure 205.

A first length 230a of each of the wires 230 of the second set extends over the first circuitry 207 and is spaced apart from the electrical components 203 of the first circuitry 207 so as not to be in contact with the electrical components 203. The first lengths 230a of the wires 230 of the second set are substantially parallel to one another. Second and third lengths 230b and 230c, respectively, of each of the wires 230 of the second set extend between opposite ends of their respective first lengths 230a of the second wires 230 and the common electrical ground structure 205. Ends of the second and third lengths 230b and 230c, respectively, are connected to the third and fourth portions 205c and 205d, respectively, of the common electrical ground structure 205.

The compartment EMI shield 210 shown in FIG. 6 is identical to the compartment EMI shield 110 shown in FIGS. 5A and 5B except that the compartment EMI shield 210 shown in FIG. 6 further includes first and second wires 231 and 232, respectively, that extend along opposite sides of the compartment EMI shield 210 adjacent the first and second portions 205a and 205b, respectively, of the common electrical ground structure 205. These additional wires 231 and 232 improve the EMI shielding effectiveness and the mechanical stability of the compartment EMI shield 210 over those of the compartment EMI shield 110 shown in FIGS. 5A and 5B. Using typical bond wires for the wires 220, 230, 231 and 232 and pitches of 500 microns and 400 microns for the wires 220 and 230, respectively, this configuration of the compartment EMI shield 210 results in about a 5 dB improvement in EMI shielding over that achieved using the compartment EMI shield 110 shown in FIGS. 5A and 5B.

Figure 7A:
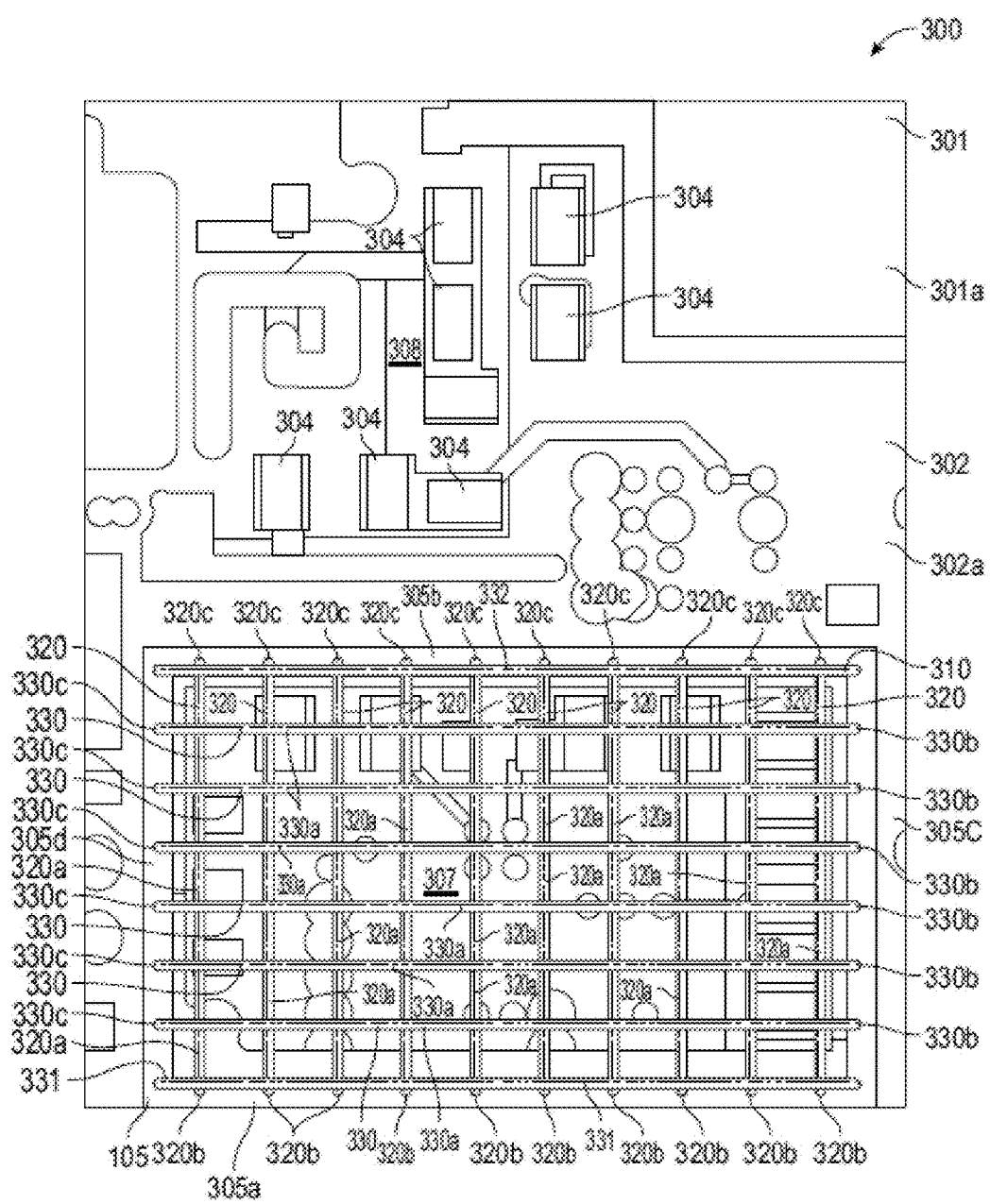
FIGS. 7A and 7B illustrate top plan and top perspective views, respectively, of a portion of an SiP module package having a compartment EMI shield in accordance with a representative embodiment.
Figure 7B:
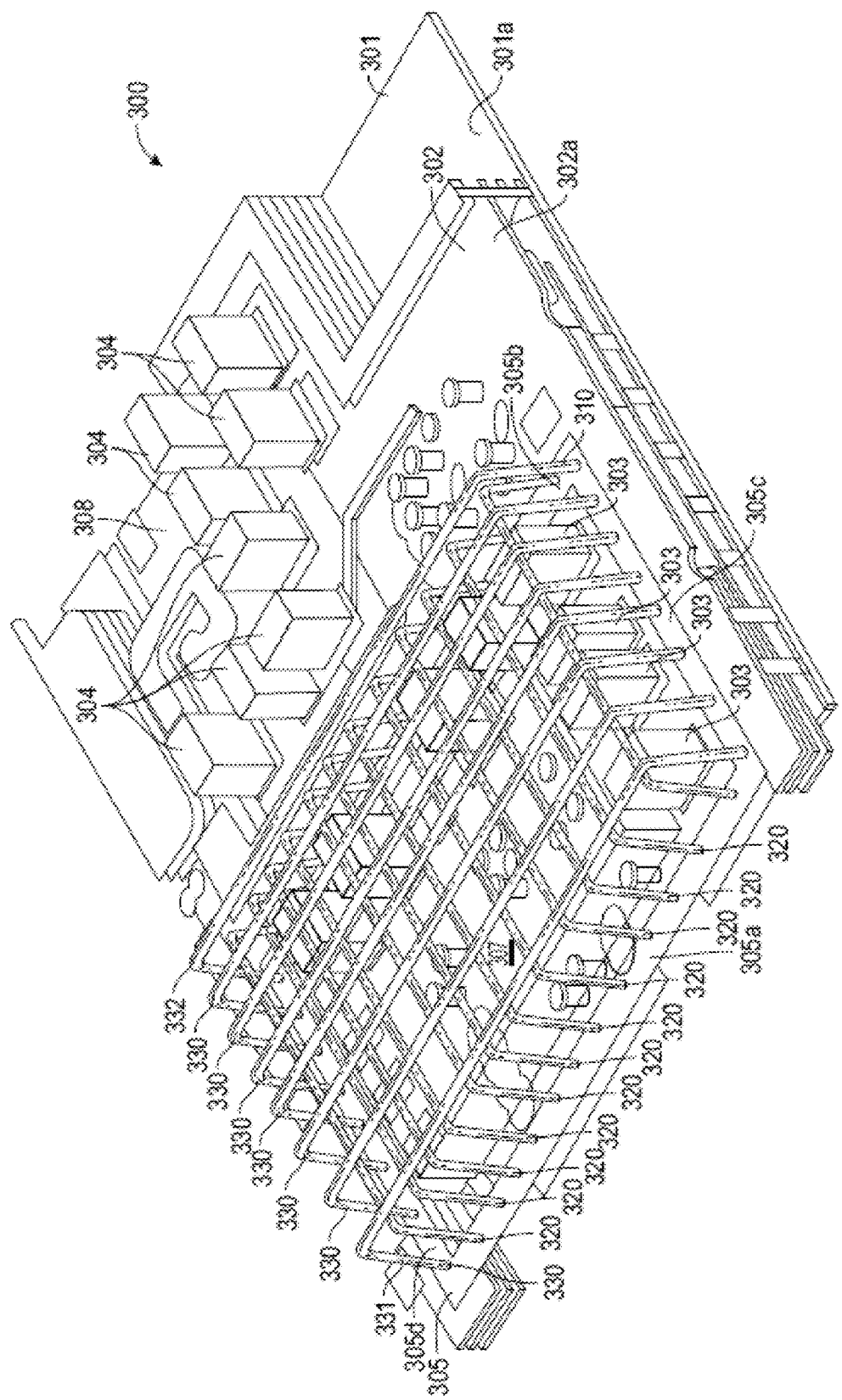

FIGS. 7A and 7B illustrate top plan and top perspective views, respectively, of a portion of an SiP module package 300 having a compartment EMI shield 310 in accordance with a representative embodiment. In FIGS. 7A and 7B, the EMC of the SiP module package 300 has been omitted so that components inside of the SiP module package 300 are visible. The SiP module package 300 has a system PCB 301, a substrate 302 disposed on a top surface 301a of the system PCB 301, a first set of electrical components 303 mounted on a top surface 302a of the substrate 302, a second set of electrical components 304 mounted on the top surface 302a of the substrate 302, a common electrical ground structure 305 disposed on the top surface 302a of the substrate 302, and the compartment EMI shield 310 secured to the common electrical ground structure 305. The first set of electrical components 303 comprises a first circuitry 307. The second set of electrical components 304 comprises a second circuitry 308. The compartment EMI shield 310 surrounds and extends over the first circuitry 307.

As with the representative embodiment shown in FIGS. 5A-6, in accordance with this exemplary embodiment, the compartment EMI shield 310 comprises first and second sets of electrically-conductive wires 320 and 330, respectively. The compartment EMI shield also includes additional electrically-conductive wires 331 and 332. First and second ends of the first set of electrically-conductive wires 320 are connected to first and second portions 305a (FIG. 7A) and 305b (FIG. 7B), respectively, of the common electrical ground structure 305. First and second ends of the second set of electrically-conductive wires 330 are connected to third and fourth portions 305c and 305d, respectively, of the common electrical ground structure 305. Each wire 320 of the first set includes first, second and third lengths 320a, 320b and 320c, respectively (FIG. 7A). Each wire 330 of the second set includes first, second and third lengths 330a, 330b and 330c, respectively (FIG. 7A). First and second ends of the additional electrically-conductive wires 331 and 332 are connected to the third and fourth portions 305c (FIG. 6A) and 305d (FIG. 7B), respectively, of the common electrical ground structure 305.

The compartment EMI shield 310 shown in FIGS. 7A and 7B is identical to the compartment EMI shield 210 shown in FIG. 6 except that the pitch between adjacent wires 320 of the first set and the pitch between adjacent wires 330 of the second set is smaller than the pitch between adjacent wires 220 of the first set and between adjacent wires 230 of the second set. For example, in accordance with this exemplary embodiment, the pitch between adjacent wires 320 of the first set is 250 microns and the pitch between adjacent wires 330 of the second set is 250 microns. Using typical bond wires for the wires 320 and 330 and pitches of 250 microns and 250 microns, respectively, this configuration of the compartment EMI shield 310 results in about a 5 dB improvement in EMI shielding over that achieved using the compartment EMI shield 110 shown in FIGS. 5A and 5B and about a 2.5 dB improvement in EMI shielding over that achieved using the compartment EMI shield 210 shown in FIG. 6.

Figure 8A:
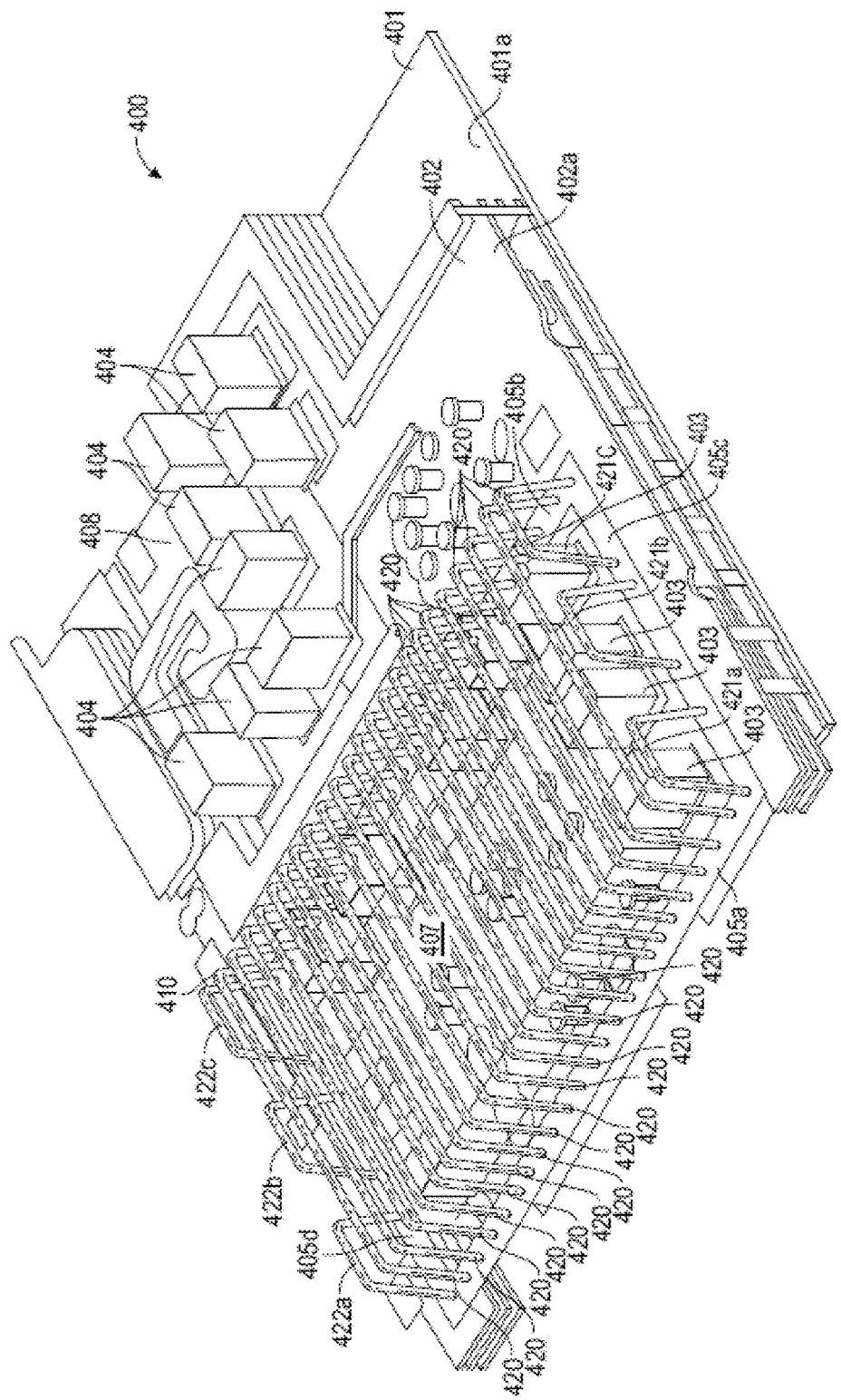
FIGS. 8A and 8B illustrate top perspective and top plan views, respectively, of a portion of an SiP module package having a compartment EMI shield in accordance with a representative embodiment.
Figure 8B:
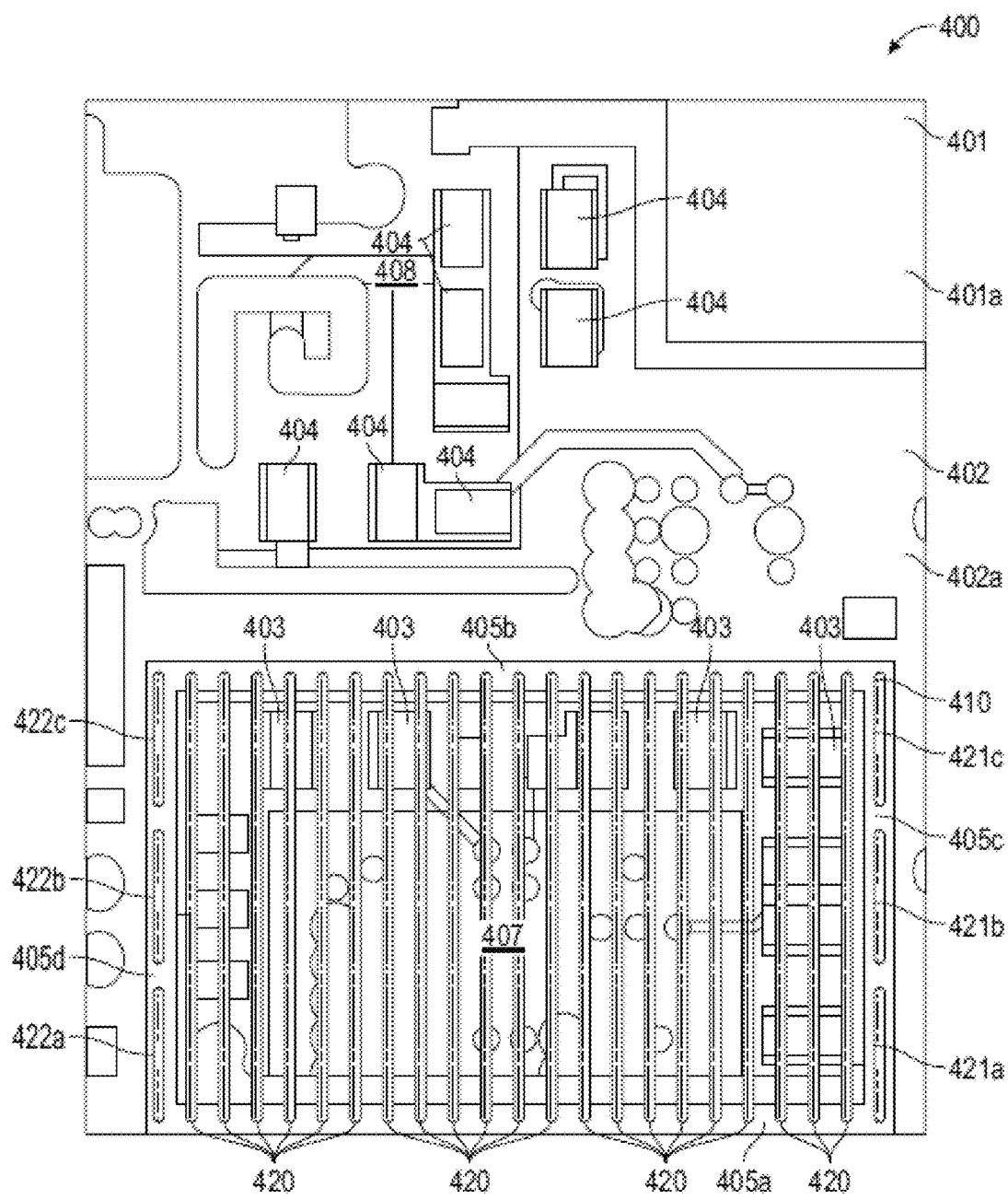

FIGS. 8A and 8B illustrate top perspective and top plan views, respectively, of a portion of an SiP module package 400 having a compartment EMI shield 410 in accordance with a representative embodiment. In FIGS. 8A and 8B, the EMC of the SiP module package 400 has been omitted so that components inside of the SiP module package 400 are visible. The SiP module package 400 has a system PCB 401, a substrate 402 disposed on a top surface 401a of the system PCB 401, a first set of electrical components 403 mounted on a top surface 402a of the substrate 402, a second set of electrical components 404 mounted on the top surface 402a of the substrate 402, a common electrical ground structure 405 disposed on the top surface 402a of the substrate 402, and the compartment EMI shield 410 secured to the common electrical ground structure 405. The first set of electrical components 403 comprises a first circuitry 407. The second set of electrical components 404 comprises a second circuitry 408. The compartment EMI shield 410 surrounds and extends over the first circuitry 407.

In accordance with this exemplary embodiment, the compartment EMI shield 410 comprises a first set of electrically-conductive wires 420 and electrically-conductive wire portions 421a-421c and 422a-422c. The wires 420 are substantially parallel to one another and have first and second ends that are connected to first and second portions 405a and 405b, respectively, of the common electrical ground structure 405. First and second ends of the wire portions 421a-421c are connected to a third portion 405c of the common electrical ground structure 405. First and second ends of the wire portions 422a-422c are connected to a fourth portion 405d of the common electrical ground structure 405.

The compartment EMI shield 410 is effective at reducing emissions of a particular frequency or range of frequencies from the first circuitry 407. The particular frequency or range of frequencies that are attenuated and the extent of attenuation depends, at least in part, on the spacing or pitch between adjacent wires 420. For example, if typical bond wires having a pitch of about 125 microns are used, an EMI shielding improvement of about 7 dB is achieved for frequencies ranging from about 1.9 GHz or about 2.5 GHz compared to EMI emissions if no compartment EMI shield is used. If typical bond wires having a pitch of about 250 microns are used, the EMI shielding improvement for frequencies ranging from about 1.9 GHz to about 2.5 GHz is about 5 dB. If typical bond wires having a pitch of about 500 microns are used, the EMI shielding improvement for frequencies ranging from about 1.9 GHz to about 2.5 GHz is about 2 to 3 dB.

Figure 9:
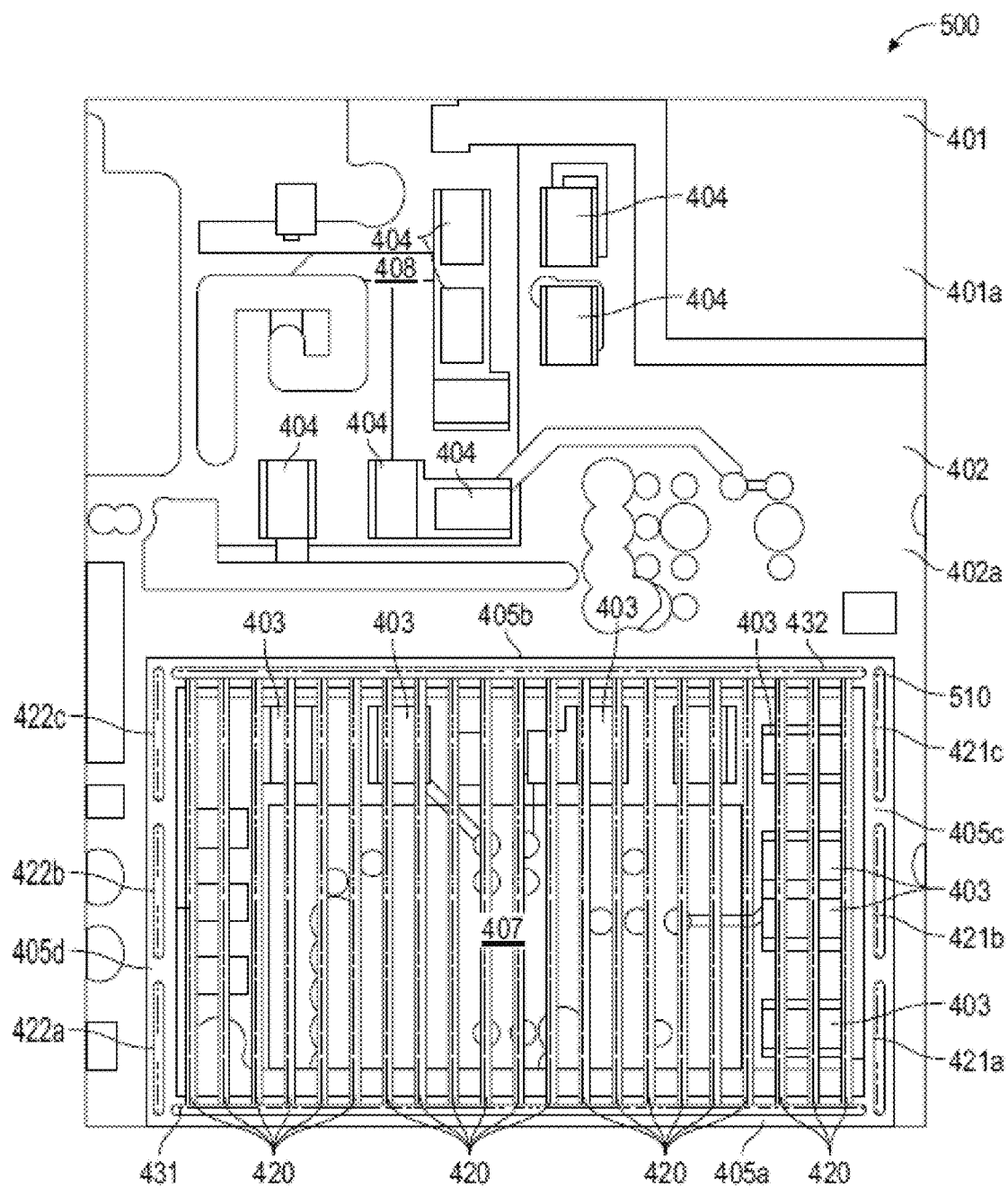
FIG. 9 illustrates a top plan view of a portion of an SiP module package that is identical to the portion of the SiP module package shown in FIGS. 8A and 8B except that the compartment EMI shield of the portion of the SiP module package shown in FIG. 9 further includes first and second wires that extend along opposite sides of the compartment EMI cage.

FIG. 9 illustrates a top plan view of a portion of an SiP module package 500 that is identical to the portion of the SiP module package 400 shown in FIGS. 8A and 8B except that the compartment EMI shield 510 of the portion of the SiP module package 500 shown in FIG. 9 further includes first and second wires 431 and 432, respectively, that extend along opposite sides of the compartment EMI shield 510 adjacent the first and second portions 405a and 405b, respectively, of the common electrical ground structure 405. These additional wires 431 and 432 further improve the effectiveness of the compartment EMI shield 510 and the mechanical stability of the compartment EMI shield 510 over those of the compartment EMI shield 410 shown in FIGS. 8A and 8B. For example, with respect to EMI shielding effectiveness, assuming typical bond wires having a pitch of about 125 microns are used for the wires 420, the compartment EMI shield 510 provides an improvement in EMI shielding of about 4 dB for frequencies ranging from about 1.9 GHz or about 2.5 GHz compared to that achieved by the compartment EMI shield 410 having the configuration shown in FIGS. 8A and 8B.

Figure 10:
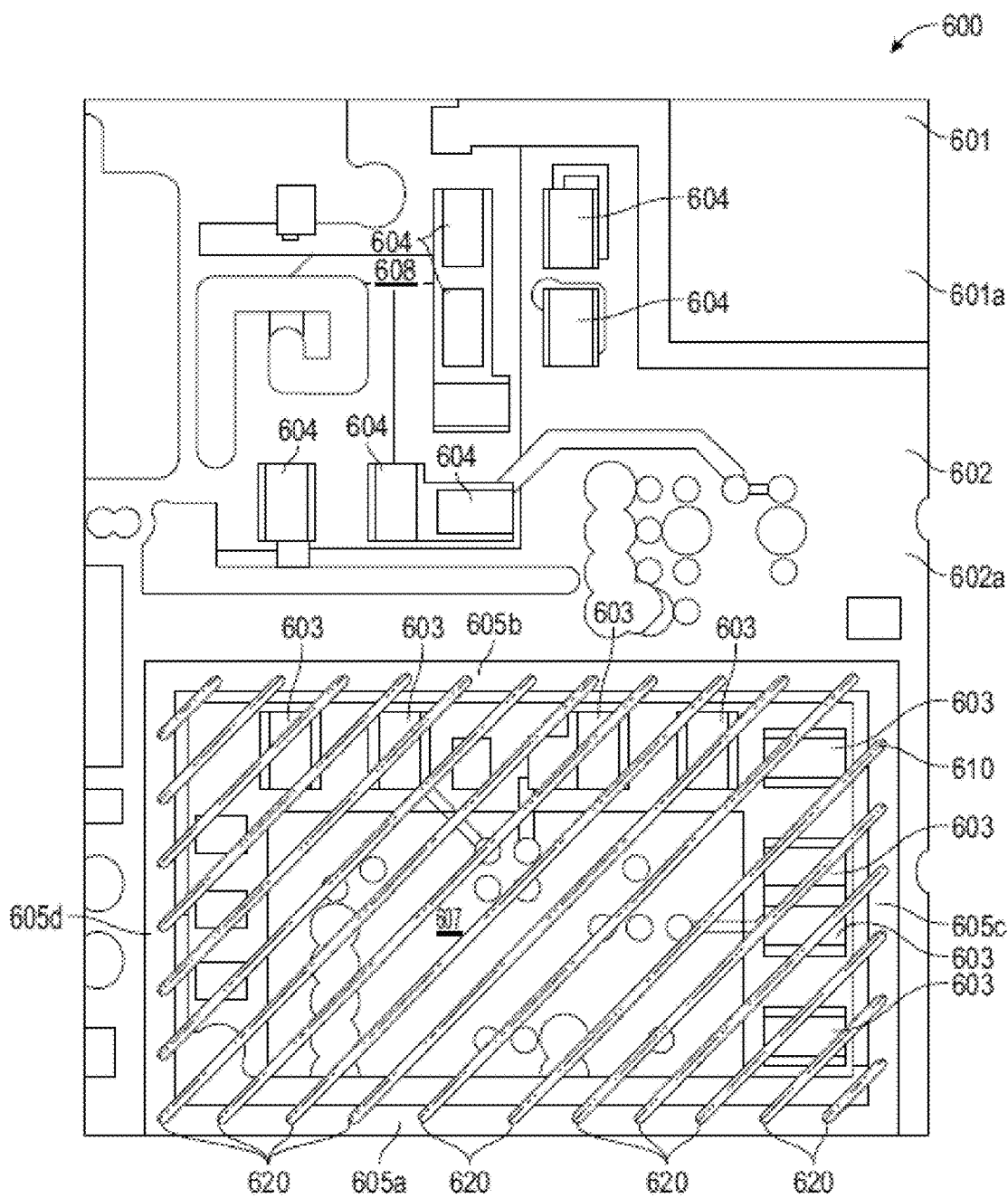
FIG. 10 illustrates a top plan view of a portion of an SiP module package having a compartment EMI shield in accordance with another exemplary embodiment.

FIG. 10 illustrates a top plan view of a portion of an SiP module package 600 having a compartment EMI shield 610 in accordance with another exemplary embodiment. The EMC of the SiP module package 600 has been omitted so that components inside of the SiP module package 600 are visible. The SiP module package 600 has a system PCB 601, a substrate 602 disposed on a top surface 601a of the system PCB 601, a first set of electrical components 603 mounted on a top surface 602a of the substrate 602, a second set of electrical components 604 mounted on the top surface 602a of the substrate 602, a common electrical ground structure 605 disposed on the top surface 602a of the substrate 602, and the compartment EMI shield 610 secured to the common electrical ground structure 605. The first set of electrical components 603 comprises a first circuitry 607. The second set of electrical components 604 comprises a second circuitry 608. The compartment EMI shield 610 surrounds and extends over the first circuitry 607.

In accordance with this exemplary embodiment, the compartment EMI shield 610 comprises a first set of electrically-conductive wires 620. The wires 620 are substantially parallel to one another, have first ends that are connected to either a first or a fourth portion 605a and 605d, respectively, of the common electrical ground structure 605, and have second ends that are connected to either a second or a third portion 605b and 605c, respectively, of the common electrical ground structure 605. Each of the wires 620 is at an acute angle, α, relative to the portion of the common electrical ground structure 605 to which first and second ends of the wire 620 are connected. Stated another way, all of the wires 620 are at an acute angle α relative to side walls of the electrical components 603 over and above which the wires 620 extend. In accordance with the representative embodiment shown in FIG. 10, the acute angle α is 45°, although other acute angles could be used. The acute angle α typically ranges from about 30° to about 60°.

The compartment EMI shield 610 is effective at reducing emissions of a particular frequency or range of frequencies from the first circuitry 607. The particular frequency or range of frequencies that are attenuated and the extent of attenuation depends, at least in part, on the pitch between adjacent wires 620. For example, if typical bond wires having a pitch of about 250 microns are used for the compartment EMI shield 610, it provides about the same EMI shielding effect as that provided by the compartment EMI shield 510 shown in FIG. 9 having the same pitch, and provides about a 5 dB improvement compared to the case where no compartment EMI shield is used.

Figure 11:
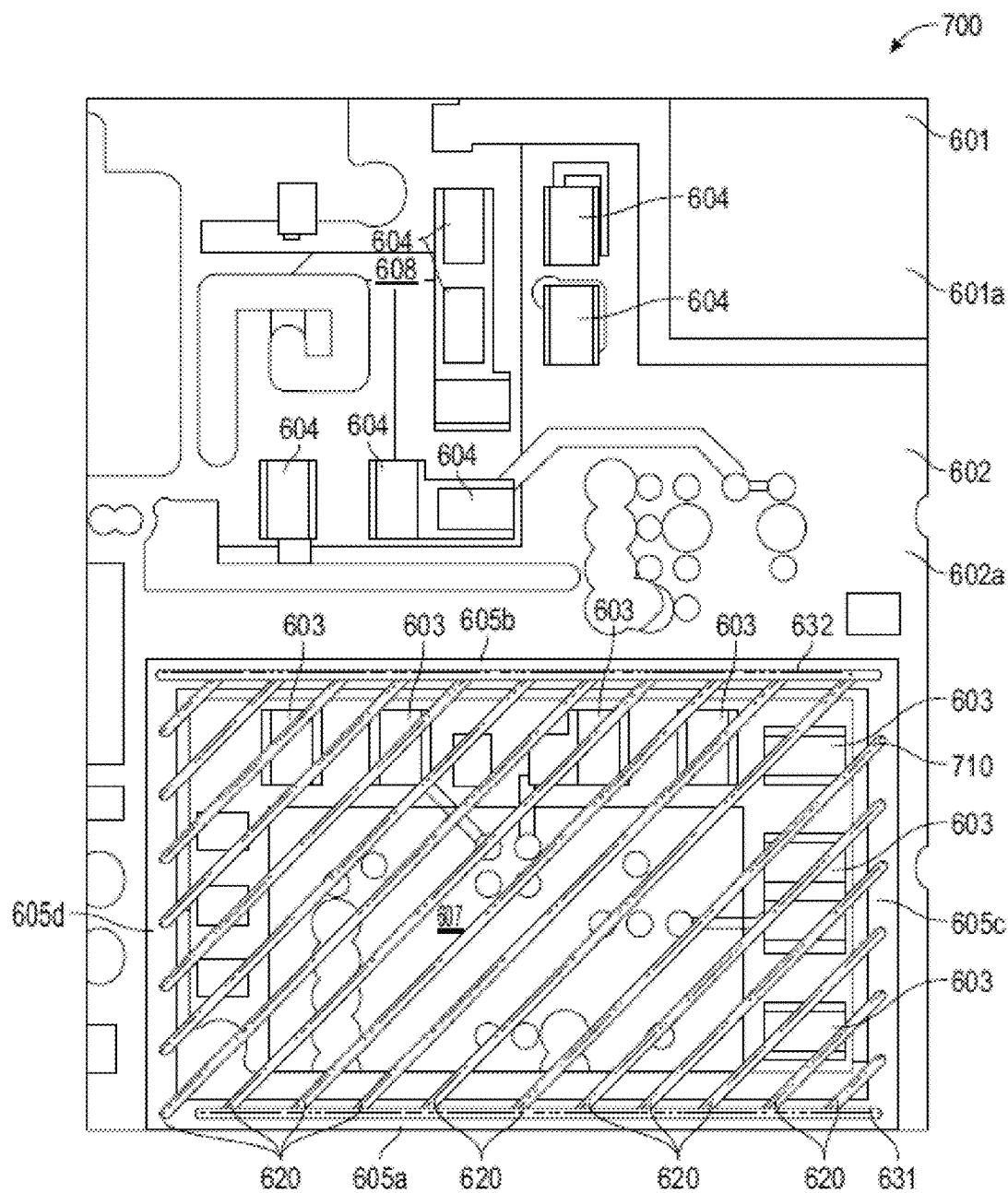
FIG. 11 illustrates a top plan view of a portion of an SiP module package that is identical to the portion of the SiP module package shown in FIG. 10 except that the compartment EMI shield of the SiP module package shown in FIG. 11 further includes first and second electrically-conductive wires that extend along opposite sides of the compartment EMI cage.

FIG. 11 illustrates a top plan view of a portion of an SiP module package 700 that is identical to the portion of the SiP module package 600 shown in FIG. 10 except that the compartment EMI shield 710 of the SiP module package 700 shown in FIG. 11 further includes first and second electrically-conductive wires 631 and 632, respectively, that extend along opposite sides of the compartment EMI cage 710 adjacent the first and second portions 605a and 605b, respectively, of the common electrical ground structure 605. The first and second electrically-conductive wires 631 and 632, respectively, are substantially parallel to one another and are substantially parallel to the first and second portions 605a and 605b, respectively, of the common electrical ground structure 605. These additional wires 631 and 632 further improve the EMI shielding effectiveness and the mechanical stability of the compartment EMI shield 710 over that provided by the compartment EMI shield 610 shown in FIG. 10. With respect to EMI shielding effectiveness, assuming that typical bond wires having a pitch of about 250 microns are used for the wires 620, the compartment EMI shield 710 provides an improvement in EMI shielding of about 4 dB for frequencies ranging from about 1.9 GHz or about 2.5 GHz compared to that achieved by the compartment EMI shield 610 shown in FIG. 10.

Figure 12A:
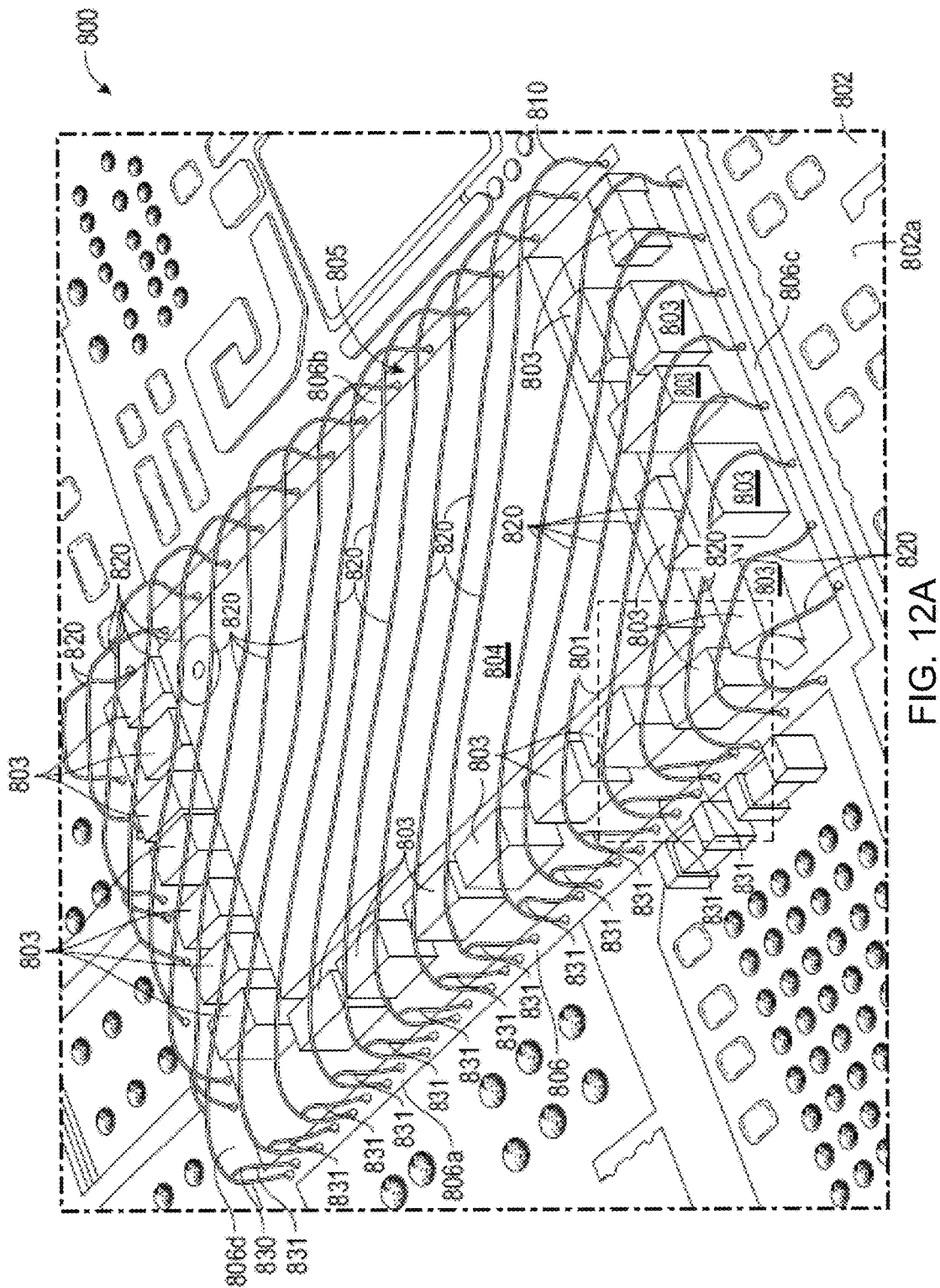
FIG. 12A illustrates a top perspective view of a portion of an SiP module package in accordance with a representative embodiment.
Figure 12B:
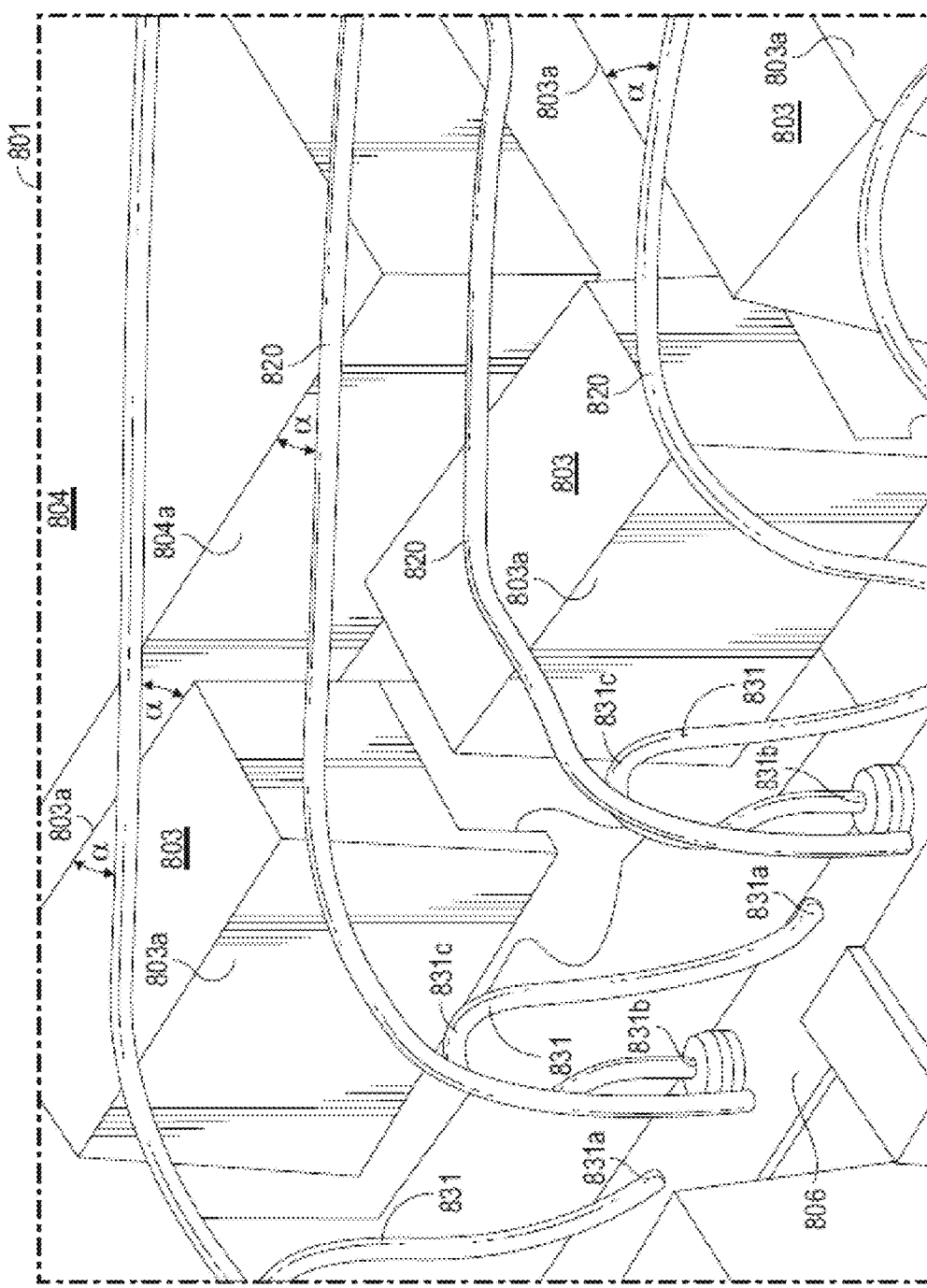
FIG. 12B illustrates an enlarged view of the area contained in dashed box shown in FIG. 12A.

FIG. 12A illustrates a top perspective view of a portion of an SiP module package 800 in accordance with a representative embodiment. FIG. 12B illustrates an enlarged view of the area contained in dashed box 801 shown in FIG. 12A. The EMC of the SiP module package 800 has been omitted so that components inside of the SiP module package 800 are visible. The SiP module package 800 has a PCB 802, electrical components 803 and 804 mounted on a top surface 802a of the PCB 802 and comprising a first circuitry 805, a common electrical ground structure 806 disposed on the top surface 802a of the PCB 802, and the compartment EMI shield 810 secured to the common electrical ground structure 806. The compartment EMI shield 810 surrounds and extends over the first circuitry 805.

The compartment EMI shield 810 is very similar to the compartment EMI shield 610 shown in FIG. 10 in that electrically-conductive wires 820 of the shield 810 are substantially parallel to one another and are at an acute angle α relative to the portions of the common electrical ground structure 806 to which ends of the wires 820 are connected.

The wires 820 have first ends that are connected to either a first or a fourth portion 806a and 806d, respectively, of the common electrical ground structure 806, and have second ends that are connected to either a second or a third portion 806b and 806c, respectively, of the common electrical ground structure 806. Each of the wires 820 is at the acute angle α relative to the portions of the common electrical ground structure 806 to which the first and second ends of the wire 820 are connected. Stated another way, all of the wires 820 are at the acute angle α relative to side walls of the electrical components 803 or 804 over and above which the wires 820 extend. In accordance with the representative embodiment shown in FIGS. 12A and 12B, the acute angle α is 45°, although other acute angles could be used. For example, the acute angle α typically ranges from about 30° to about 60°.

In addition to the wires 820, the compartment EMI shield 810 includes a peripheral wire fence 830 that extends along the first portion 806a of the common electrical ground structure 806. The peripheral wire fence 830 comprises a plurality of short wire segments 831 having first and second ends that are connected to the common electrical ground structure 806. Each wire segment 831 has a first end that is connected to a location on the common electrical ground structure 806 and a second end that is connected to a nearby location on the common electrical ground structure 806. In accordance with this exemplary embodiment, the first and second ends of all of the wire segments 831 are connected to the first portion 806a of the common electrical ground structure 806, but in other embodiments, the first and second ends may be connected to other portions of the common electrical ground structure 806, as was demonstrated above with reference to FIG. 10.

With reference to FIG. 12B, each wire segment 831 extends upwardly away from where the first end 831a of the wire segment 831 is connected to the common electrical ground structure 806, then bends and extends downwardly toward where the second end 831b of the wire segment 831 is connected to the common electrical ground structure 806. The wires 820 come into contact with respective wire segments 831 of the peripheral wire fence 830. The peripheral wire fence 830 improves the EMI shielding effectiveness of the compartment EMI shield 810 and prevents the wires 820 from coming into contact with the electrical components 803, 804 of the first circuitry 805. In accordance with this exemplary embodiment, the electrical components 803 and 804 are rectangular in shape and have sides 803a and 804a, respectively, that are parallel to one another and that are at the acute angle α relative to the portions of the wires 820 that extend over and above them.

In accordance with a representative embodiment, top portions 831c (FIG. 12B) of the wire segments 831 are at a sufficient height from the common electrical ground structure 806 to ensure that the bonding angle, i.e., the angle at which the wire 820 approaches the portion of common electrical ground structure 806, is sufficiently large to ensure that the wires 820 do not come into contact with the electrical components 803, 804. In other words, because the wires 820 are forced to pass over the top portions 831c of the wire segments 831, the height of the top portions 831c dictates the height of the respective wires 820 at the locations at which the wires 820 pass over the respective top portions 831c. In this way, the height of the top portions 831c is selected to ensure that there is sufficient clearance between the wires 820 and the top surfaces of the electrical components 803, 804.

Figure 13:
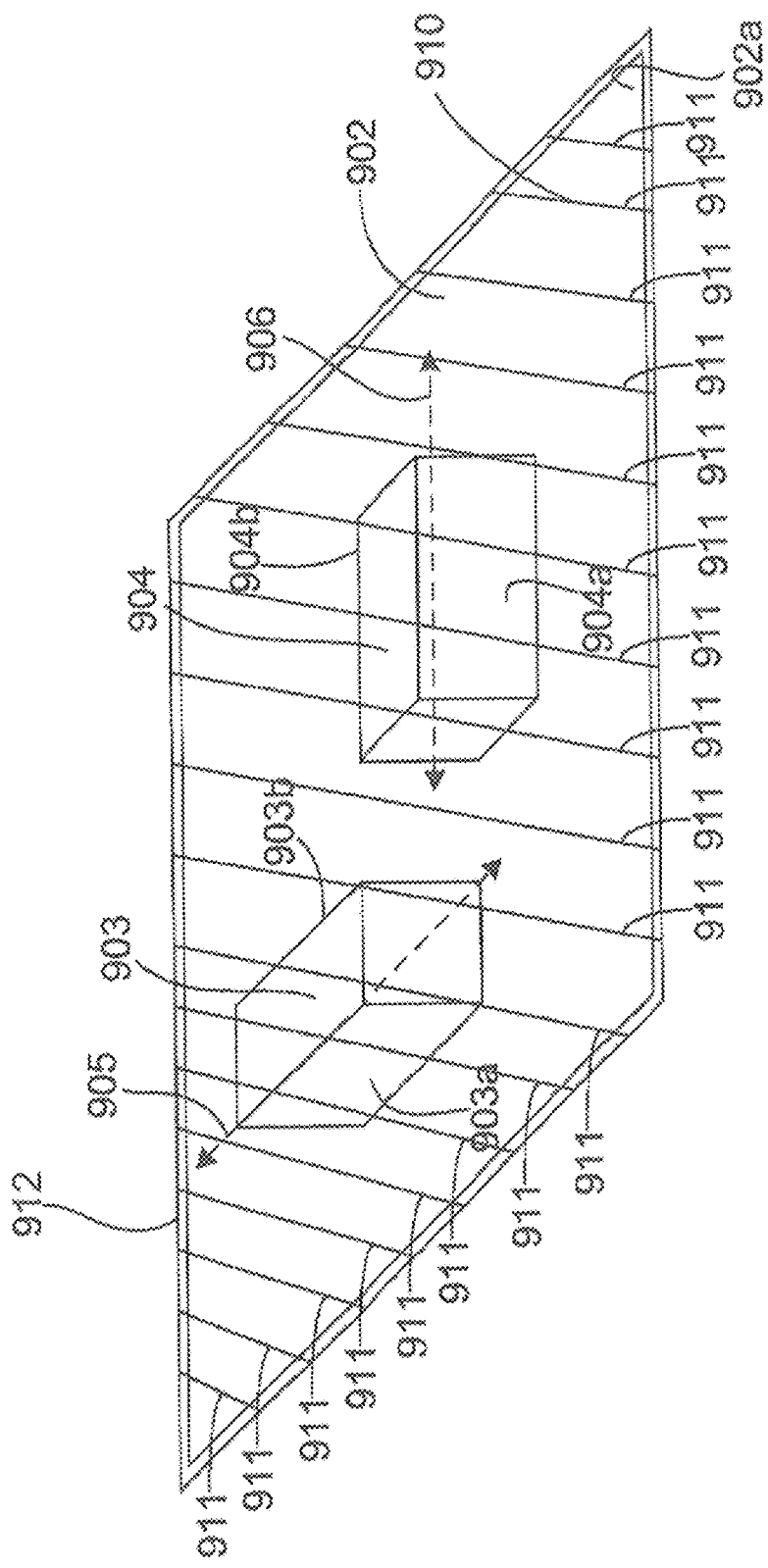
FIG. 13 illustrates a top perspective view of a portion of a substrate having two electrical components mounted on a top surface thereof and having a compartment EMI shield that may be identical to the compartment EMI shield shown in FIG. 10.

FIG. 13 illustrates a top perspective view of a portion of a substrate 902 having two electrical components 903 and 904 mounted on a top surface 902a thereof and having a compartment EMI shield 910 that may be identical to the compartment EMI shield 610 shown in FIG. 10. In accordance with this exemplary embodiment, the electrical components 903 and 904 are first and second inductors, respectively, having respective axes 905 and 906 that are perpendicular to one another and parallel to a plane in which the top surface 902a of the substrate 902 resides. The compartment EMI shield 910 comprises a plurality of electrically-conductive wires 911 that are substantially parallel to one another and that are at an acute angle, α, to the axes 905 and 906 of the first and second inductors 903 and 904, respectively. Stated another way, opposite sides 903a and 903b of the first inductor 903 are parallel to one another and are at the acute angle α relative to the wires 911. Likewise, opposite sides 904a and 904b of the second inductor 904 are parallel to one another and are at the acute angle α relative to the wires 911. Ends of the wires 911 are connected to a common electrical ground structure 912.

The value of α is typically 45°, but ranges from about 30° to about 60°. Electrical currents flowing in the respective coils that comprise the first and second inductors 903 and 904 cause magnetic fluxes, B1 and B2, to be generated, respectively. The respective magnetic fluxes B1 and B2 are parallel to the axes 905 and 906, respectively. The wires 911 are at the acute angle, α, to the magnetic fluxes B1 and B2, respectively. With respect to EMI shielding effectiveness, assuming that typical bond wires with a pitch of about 250 microns are used, and assuming frequencies ranging from 1.9 GHz to 2.5 GHz, the compartment EMI shield 910 has an EMI shielding effectiveness that is about the same as that of the compartment EMI shield 510 shown in FIG. 9 and provides about a 5 dB improvement over the compartment EMI shield 410 shown in FIGS. 8A and 8B.

Figure 14:
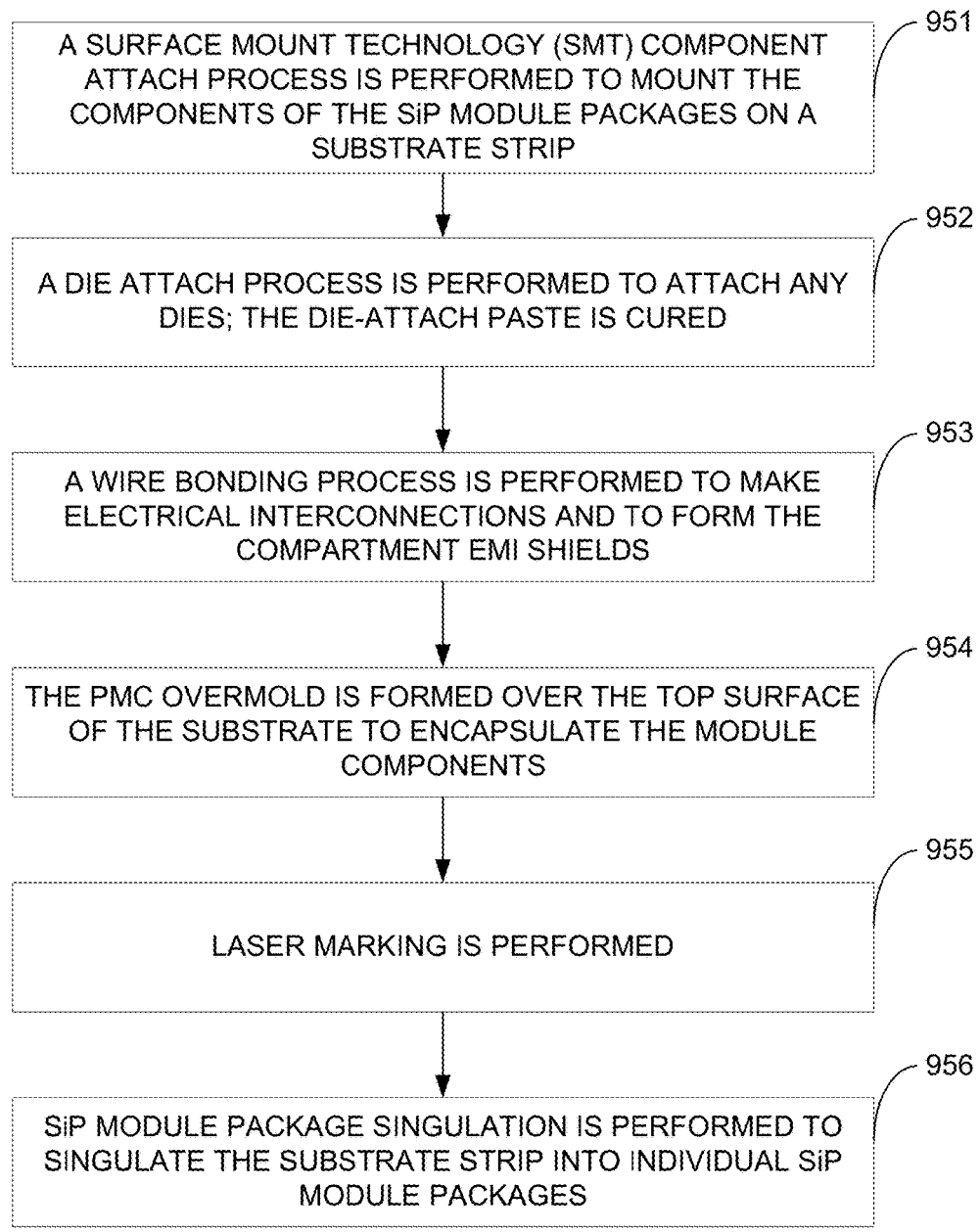
FIG. 14 illustrates a flow diagram corresponding to the method of forming the compartment EMI shield in accordance with a representative embodiment.

FIG. 14 illustrates a flow diagram corresponding to the method of forming the compartment EMI shield in accordance with a representative embodiment. In accordance with this exemplary embodiment, the compartment EMI shield is formed as part of the known wire bonding process that is performed to interconnect electrical elements when making an SiP module package. For clarity and in the interest of brevity, some conventional process steps may be omitted.

The components that will make up the SiP package modules are mounted on a substrate strip using known surface mount technology (SMT) processes and tools, as indicated by block 951. Any semiconductor dies that need to be mounted by a known die-attach process are then mounted on the substrate strip and the die-attach paste is cured, as indicated by block 952. The processes represented by blocks 951 and 952 are known processes that are currently performed in making SiP module packages.

A known wire bonding process is then performed to make electrical interconnections and to form the compartment EMI shields over the circuitry, as indicated by block 953. Each SiP module package may have more than one block of circuitry, and each block of circuitry may have its own compartment EMI shield. In some cases, however, it may not be necessary to provide every block of circuitry with its own compartment EMI shield.

It should be noted that by forming the compartment EMI shields as part of the wire bonding process, the SiP module package manufacturing process does not have to be altered to incorporate a separate process for forming the compartment EMI shields. Therefore, no capital investment is needed (e.g., retooling) to form the compartment EMI shields. It should also be noted that it is not necessary to use to same gauge bonding wire for the electrical interconnections and for the compartment EMI shields. The gauge of wire that is used for this purpose may depend on a variety of factors, including, for example, the targeted shielding efficiency for the frequencies of interest and cost considerations.

After the wire bonding process has been performed, a known PMC over-molding process is performed to form the PMCs of the SiP module packages, as indicated by block 954. After the PMCs have been formed, any laser markings that are needed are formed on the PMCs using a known laser marking process, as indicated by block 955. The populated substrate strip with the PMCs is then singulated into the individual SiP module packages, as indicated by block 956.

Figure 15:
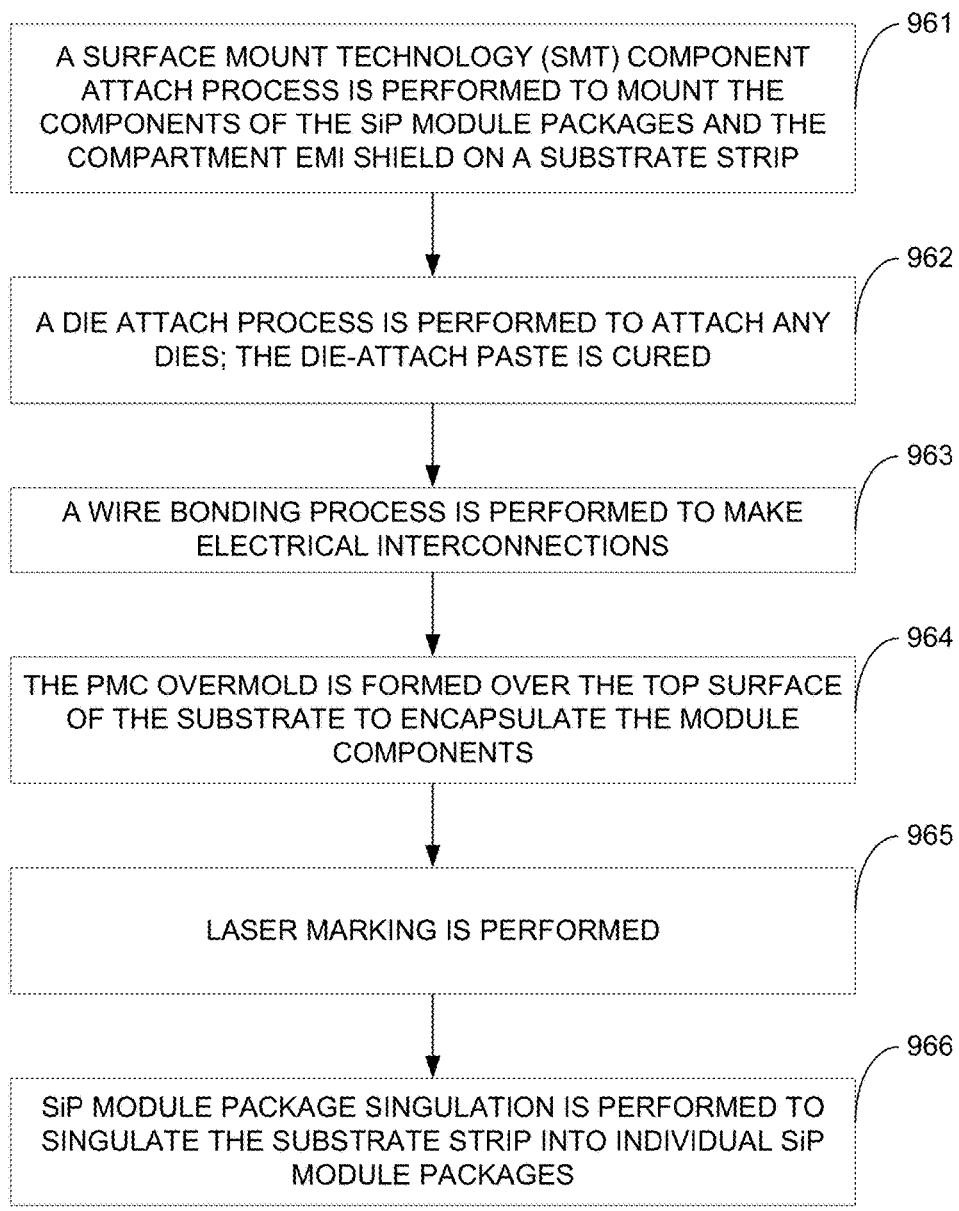
FIG. 15 illustrates a flow diagram corresponding to the method of forming the compartment EMI shield in accordance with another exemplary embodiment.

FIG. 15 illustrates a flow diagram corresponding to the method of forming the compartment EMI shield in accordance with another exemplary embodiment. In accordance with this exemplary embodiment, the compartment EMI shield is pre-formed in a separate process and is attached during the SMT component mounting process. The components that will make up the SiP package modules and the compartment EMI shields are mounted on a substrate strip using known SMT processes and tools, as indicated by block 961. Any suitable process may be used to make the compartment EMI shields.

A known die-attach process is used to mount any semiconductor dies that are needed and the die-attach paste is cured, as indicated by block 962. A known wire bonding process is then performed to make electrical interconnections, as indicated by block 963. After the wire bonding process has been performed, the PMC over-molding process is performed to form the PMCs of the SiP module packages, as indicated by block 964. After the PMCs have been formed, any laser markings that are needed are formed on the PMCs, as indicated by block 965. The populated substrate strip is then singulated into the individual SiP module packages, as indicated by block 966.

The electrical components 103, 104, 203, 204, 303, 304, 403, 404, 603, 604, 803, 804 may be passive electrical components (e.g., inductors, capacitors and resistors), active electrical components (e.g., transistors and amplifiers) or IC chips or dies. In the case of an IC chip or die, the component may be, for example, a power amplifier (PA) or a low-noise amplifier (LNA). In some embodiments, one or more of these electrical components forms a radio frequency (RF) block and the compartment EMI shield is used to reduce EMI emissions from the RF block. The SiP module packages described herein are typically, but not necessarily, incorporated into a wireless device or a wireless communications system, such as a smart phone, for example.

The process described above with reference to blocks 951-953 in FIG. 14 for forming the compartment EMI shield may also be used to form the EMI shield 20 described above with reference to FIGS. 2 and 3. Likewise, the process described above with reference to blocks 961-963 in FIG. 15 for forming the compartment EMI shield may also be used to form the EMI shield 20 described above with reference to FIGS. 2 and 3. In the interests of brevity, those same process steps for forming the EMI shield 20 shown in FIGS. 2 and 3 are not repeated herein.

It should also be noted that the designs of the compartment EMI shields shown in FIGS. 5A-13 may also be used for the EMI shields used with the first inductors 11 and 31, respectively, shown in FIGS. 2 and 4, respectively. In other words, although the EMI shields 20 and 40 and shown in FIGS. 2 and 4, respectively, comprises single sets of wires 21 and 41, respectively, that are substantially parallel to one another, the EMI shields 20 and 40 could further comprise second sets of electrically-conductive wires that are substantially parallel to one another, but that are not parallel to the first sets of wires 21 and 41, respectively. For example, the second set could be perpendicular to the first set similar to what is shown in FIGS. 5A and 5B.

It should be noted that although the illustrative embodiments have been described with reference to a few illustrative embodiments for the purpose of demonstrating the principles and concepts of the invention. Persons of skill in the art will understand how the principles and concepts of the invention can be applied to other embodiments not explicitly described herein. For example, while the compartment EMI shields and the functional blocks with which they are used are shown and described herein as being rectangular in shape, they can have virtually any desired shape. It should also be noted that the circuits and methods described above with reference to FIGS. 2-15 are merely examples of suitable circuit configurations and methods that demonstrate the principles and concepts of the invention. As will be understood by those skilled in the art in view of the description being provided herein, many modifications may be made to the embodiments described herein while still achieving the goals of the invention, and all such modifications are within the scope of the invention.

What is claimed is:

1. A radio frequency (RF) module comprising:
a multi-layer substrate having a plurality of layers and a top surface, the plurality of layers including at least N layers of metal, where N is a positive integer that is greater than or equal to 1;
at least first and second inductors disposed in the multi-layer substrate, each of the first and second inductors having at least N coils, the first and second inductors having first and second axes, respectively, that are substantially perpendicular to the top surface of the multi-layer substrate, each coil being disposed in a respective layer of metal of the N layers of metal; and
at least a first electromagnetic interference (EMI) shield at least partially surrounding and extending over the first inductor, the first EMI shield being electrically coupled to an electrical ground structure of the multi-layer substrate, the first EMI shielding reducing EMI crosstalk between the first and second inductors, the first EMI shield comprising at least a first set of electrically-conductive wires, each electrically-conductive wire comprising: a first wire portion; a second wire portion; a third wire portion; and first and second bends where the first and second wire portions, respectively, transition into the third wire portion, wherein the third wire portion is substantially parallel to a top surface of the multilayer substrate.

2. The RF module of claim 1, wherein the first and second wire portions have first ends that are electrically coupled to the electrical ground structure of the multi-layer substrate, the third wire portion extending between the first and second wire portions.

3. The RF module of claim 2, wherein the first wire portions are substantially parallel to one another and substantially perpendicular to the top surface of the multi-layer substrate, wherein the second wire portions are substantially parallel to one another and to the first wire portions and substantially perpendicular to the top surface of the multi-layer substrate, and wherein the third wire portions are substantially parallel to one another and substantially parallel to the top surface of the multi-layer substrate.

4. The RF module of claim 3, wherein when electrical current flows in the first and second inductors, the first and second inductors generate first and second magnetic fluxes, respectively, that are substantially parallel to the first and second axes, respectively, and substantially perpendicular to the third wire portions.

5. The RF module of claim 4, wherein the third wire portions are at an angle, β, relative to a line drawn between the first and second axes perpendicular to the first and second axes, and wherein the angle β ranges between 0° and 359°.

6. The RF module of claim 4, wherein the third wire portions are at a non-zero-degree angle β relative to a line drawn between the first and second axes perpendicular to the first and second axes.

7. The RF module of claim 4, wherein adjacent electrically-conductive wires are spaced apart from one another by a lateral distance, $D_L$, and wherein $D_L$ is constant for all of the electrically-conductive wires.

8. The RF module of claim 4, wherein adjacent electrically-conductive wires are spaced apart from one another by a later distance, $D_L$, and wherein $D_L$ is greater than or equal to 150 micrometers.

9. The RF module of claim 4, wherein the third wire portions of the electrically-conductive wires are spaced apart from the top surface of the multi-layer substrate by a vertical distance, $D_V$, and wherein $D_V$ is constant for all of the third wire portions.

10. The RF module of claim 4, wherein the electrically-conductive wires are bond wires.

11. The RF module of claim 4, wherein the electrically-conductive wires have a thickness, T, that ranges from about 10 micrometers (microns) to about 500 microns.

12. The RF module of claim 11, wherein the thickness, T, ranges from about 12 microns to about 60 microns.

13. A radio frequency (RF) module comprising:
a multi-layer substrate having a plurality of layers and a top surface, the plurality of layers including at least N layers of metal, where N is a positive integer that is greater than or equal to 1;
at least first and second inductors disposed in the multi-layer substrate, the first and second inductors having first and second axes, respectively, that are substantially perpendicular to the top surface of the multi-layer substrate, each of the first and second inductors having at least N coils, wherein each coil is disposed in a respective layer of metal of the N layers of metal; and
at least a first electromagnetic interference (EMI) shield at least partially surrounding and extending over the first inductor, the first EMI shield being electrically coupled to an electrical ground structure of the multi-layer substrate, the first EMI shield comprising at least a first set of electrically-conductive wires having first and second ends that are electrically coupled to the electrical ground structure, each electrically-conductive wire having a wire portion that extends between the first and second ends of the respective electrically-conductive wire substantially parallel to the top surface of the multi-layer substrate, and bends where the first and second ends transition to the wire portion, wherein the first EMI shielding reduces EMI crosstalk between the first and second inductors.

14. The RF module of claim 13, wherein the wire portion has an end that is electrically coupled to the electrical ground structure of the multi-layer substrate.

15. The RF module of claim 13, wherein when electrical current flows in the first and second inductors, the first and second inductors generate first and second magnetic fluxes, respectively, that are substantially parallel to the first and second axes, respectively, and substantially perpendicular to the wire portion.

16. The RF module of claim 15, wherein the wire portion is at an angle, β, relative to a line drawn between the first and second axes perpendicular to the first and second axes, and wherein the angle β ranges between 0° and 359°.

17. The RF module of claim 15, wherein the wire portion is at a non-zero-degree angle β relative to a line drawn between the first and second axes perpendicular to the first and second axes.

\* \* \* \* \*